(12) United States Patent
Hazue

(10) Patent No.: US 11,049,875 B2
(45) Date of Patent: Jun. 29, 2021

(54) SEMICONDUCTOR MEMORY DEVICE AND METHOD OF MANUFACTURING THE SAME

(71) Applicant: Kioxia Corporation, Minato-ku (JP)

(72) Inventor: Shunsuke Hazue, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/816,380

(22) Filed: Mar. 12, 2020

(65) Prior Publication Data

US 2021/0043646 A1 Feb. 11, 2021

(30) Foreign Application Priority Data

Aug. 6, 2019 (JP) .............................. JP2019-144613

(51) Int. Cl.
*H01L 27/11582* (2017.01)

(52) U.S. Cl.
CPC .............................. *H01L 27/11582* (2013.01)

(58) Field of Classification Search
CPC ................................................. H01L 27/11582
See application file for complete search history.

(56) References Cited

U.S. PATENT DOCUMENTS

| | | | |
|---|---|---|---|
| 10,090,321 B2 | 10/2018 | Nakajima | |
| 2015/0279855 A1 | 10/2015 | Lu et al. | |
| 2017/0236835 A1* | 8/2017 | Nakamura | ........ H01L 27/11582 257/314 |
| 2018/0277631 A1 | 9/2018 | Okumura | |

FOREIGN PATENT DOCUMENTS

| | | |
|---|---|---|
| JP | 2018-049968 A | 3/2018 |
| JP | 6374015 B2 | 8/2018 |
| JP | 2018-163963 A | 10/2018 |

\* cited by examiner

*Primary Examiner* — Zandra V Smith
*Assistant Examiner* — Molly K Reida
(74) *Attorney, Agent, or Firm* — Oblon, McClelland, Maier & Neustadt, L.L.P.

(57) ABSTRACT

A semiconductor memory device according to embodiments described herein, includes a first stacked body, a second stacked body, a first memory hole, a second memory hole, and a joint. In the first stacked body, a plurality of first conductive layers and a plurality of first insulating layers are alternately stacked. The second stacked body is disposed above the first stacked body, and a plurality of second conductive layers and a plurality of second insulating layers are alternately stacked therein. The first memory hole extends in the first stacked body in a first direction that is a stacking direction of the first stacked body. The second memory hole extends in the second stacked body in the first direction. The joint communicates the first memory hole and the second memory hole. The joint includes an inner wall surface and a sidewall insulating layer. The inner wall surface has a plane continuous with the inner wall of the first memory hole. The sidewall insulating layer is disposed on the inner wall surface of the joint.

3 Claims, 14 Drawing Sheets

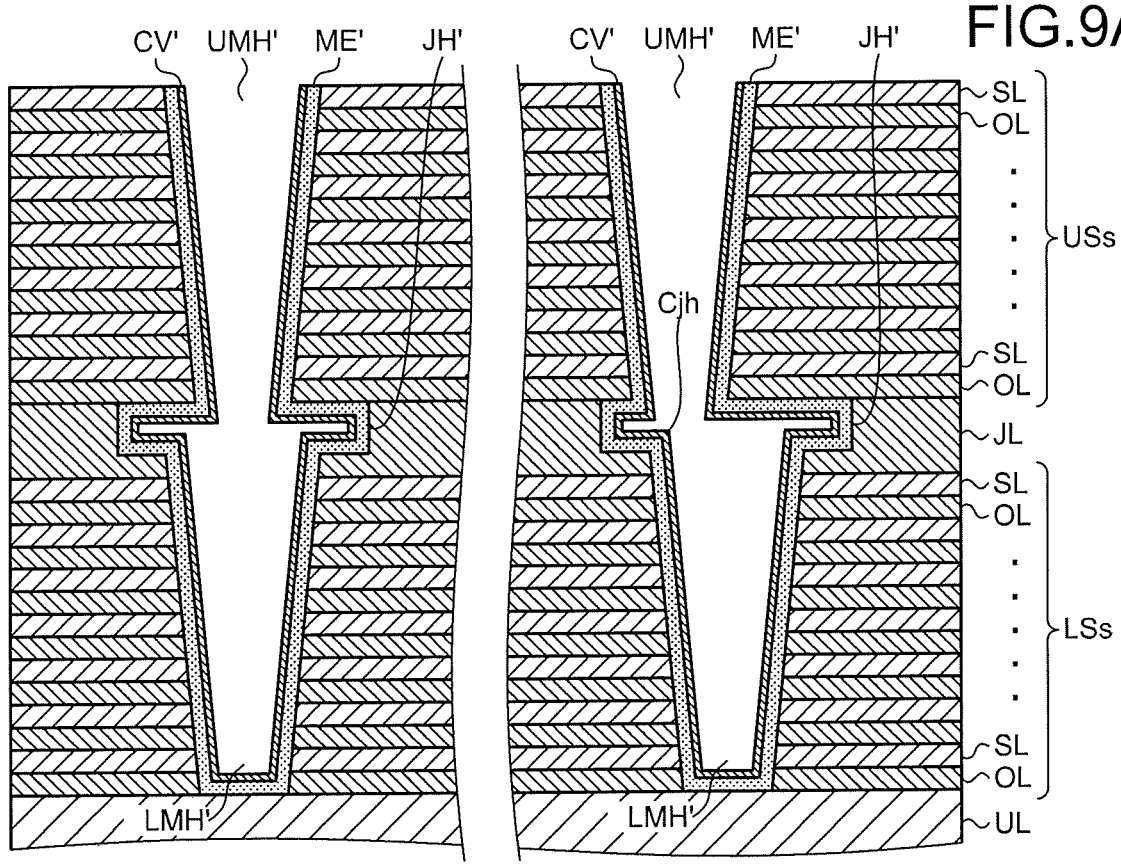
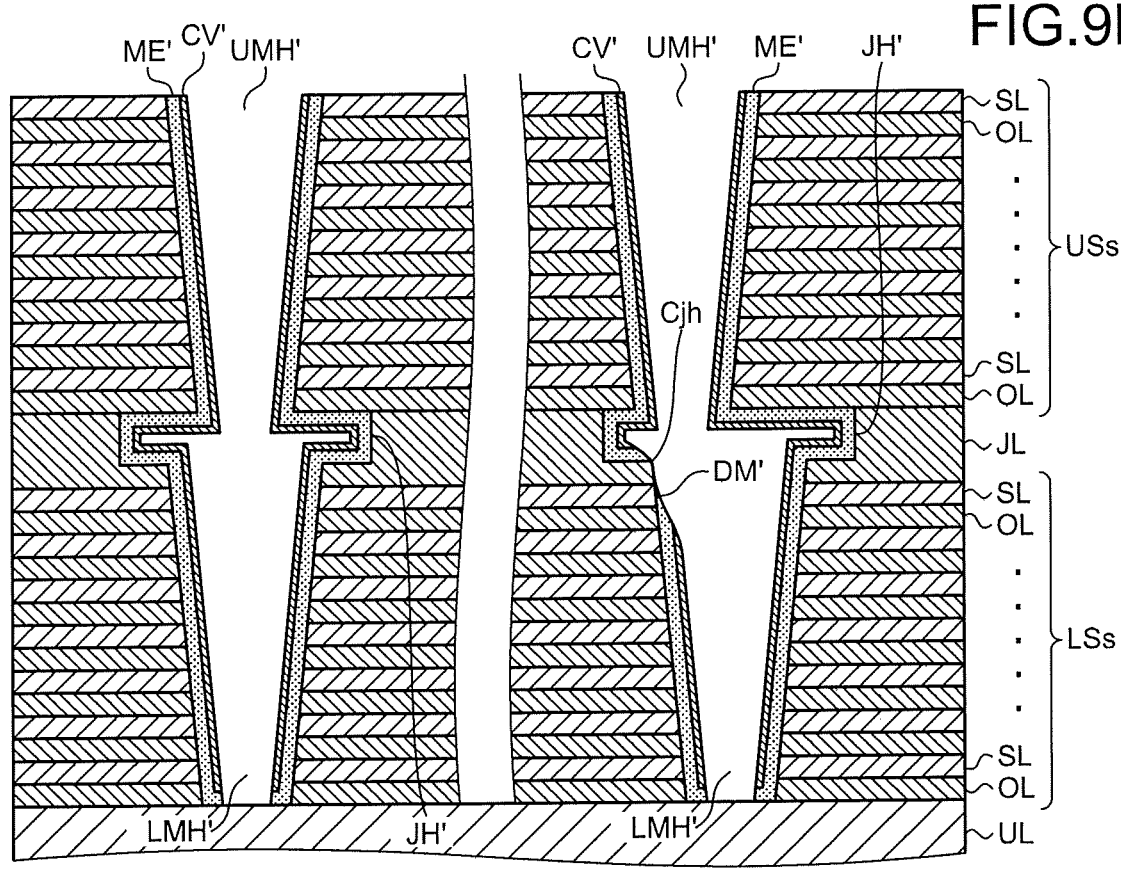

SEMICONDUCTOR MEMORY DEVICE AND METHOD OF MANUFACTURING THE SAME

CROSS-REFERENCE TO RELATED APPLICATIONS

This application is based upon and claims the benefit of priority from Japanese Patent Application No. 2019-144613, filed on Aug. 6, 2019; the entire contents of which are incorporated herein by reference.

FIELD

Embodiments of the present invention relate generally to a semiconductor memory device and a method of manufacturing the semiconductor memory device.

BACKGROUND

In the manufacturing process of a three-dimensional nonvolatile memory, a memory layer that forms a memory cell is formed in a memory hole formed in a stacked body in which a plurality of layers is stacked. Further, a process of removing, by etching, a memory layer formed on the bottom surface of a memory hole may be performed. At this time, it is desirable to remove only a bottom memory layer without etching a memory layer on the sidewall of the memory hole.

BRIEF DESCRIPTION OF THE DRAWINGS

FIGS. 9A and 9B are flowcharts illustrating an example of a procedure of a manufacturing method of a semiconductor memory device according to a comparative example;

DETAILED DESCRIPTION

A semiconductor memory device according to embodiments described herein, includes a first stacked body, a second stacked body, a first memory hole, a second memory hole, and a joint. In the first stacked body, a plurality of first conductive layers and a plurality of first insulating layers are alternately stacked. The second stacked body is disposed above the first stacked body, and a plurality of second conductive layers and a plurality of second insulating layers are alternately stacked therein. The first memory hole extends in the first stacked body in a first direction that is a stacking direction of the first stacked body. The second memory hole extends in the second stacked body in the first direction. The joint communicates the first memory hole and the second memory hole. The joint includes an inner wall surface and a sidewall insulating layer. The inner wall surface has a plane continuous with the inner wall of the first memory hole. The sidewall insulating layer is disposed on the inner wall surface of the joint.

Hereinafter, the present invention will be described in detail with reference to the drawings. Note that the present invention is not limited to the following embodiments. In addition, constituent elements in the following embodiments include those that can be easily assumed by those skilled in the art or that are substantially the same.

First Embodiment

Hereinafter, a first embodiment will be described in detail with reference to the drawings.

Configuration Example of Semiconductor Memory Device

Figure 1:
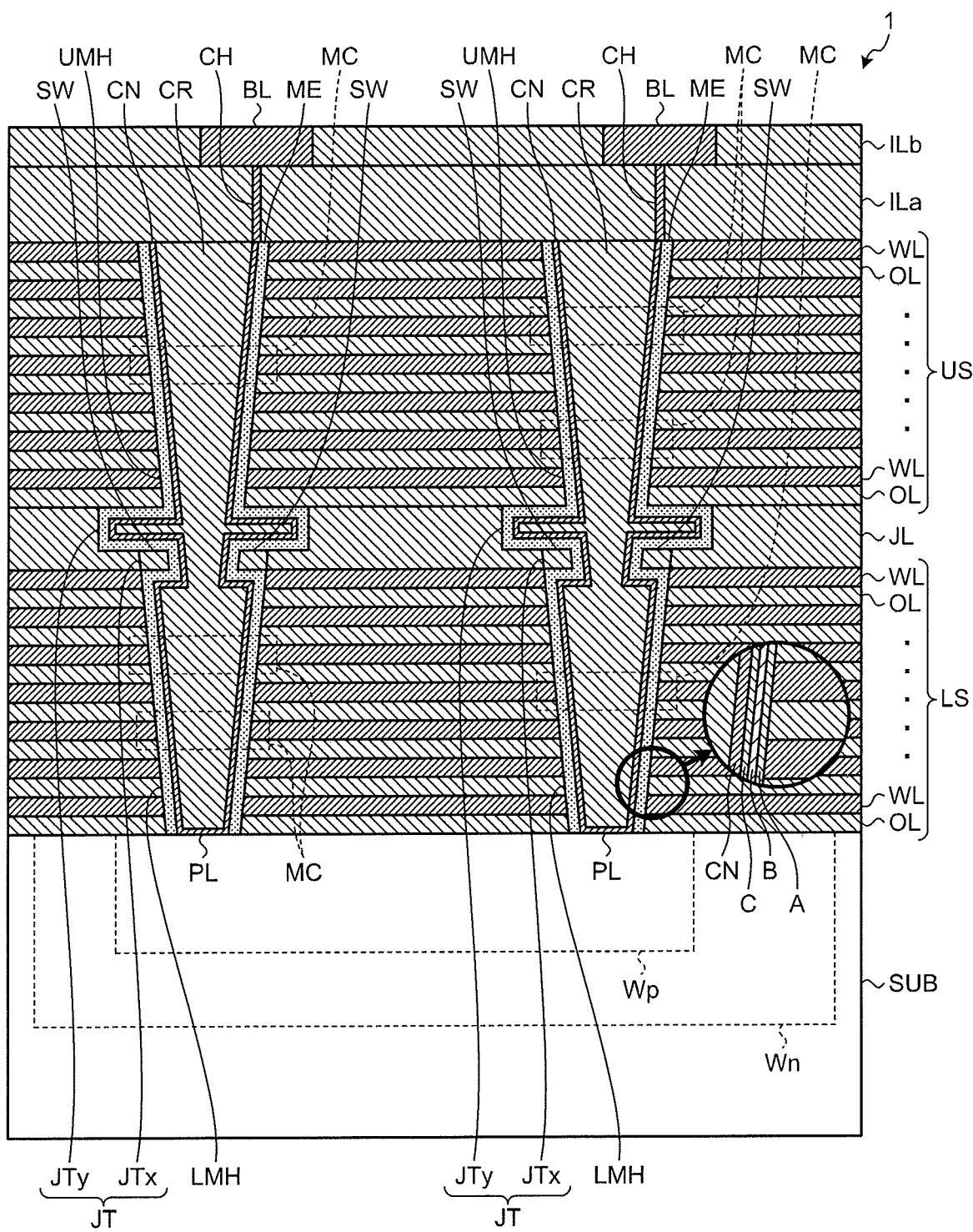
FIG. 1 is a cross-sectional view illustrating a configuration example of a semiconductor memory device according to a first embodiment.

FIG. 1 is a cross-sectional view illustrating a configuration example of a semiconductor memory device 1 according to the first embodiment. As illustrated in FIG. 1, the semiconductor memory device 1 is, for example, a three-dimensional nonvolatile memory including a substrate SUB and having memory cells MC three-dimensionally disposed above the substrate SUB.

The substrate SUB is formed of a semiconductor such as silicon. For example, an n-well Wn is disposed in a surface layer portion of the substrate SUB, and a p-well Wp is disposed in the n-well Wn.

On the substrate SUB, a stacked body LS is disposed as a first stacked body in which word lines WL as a plurality of conductive layers and a plurality of insulating layers OL are alternately stacked. The word line WL is made of at least one of, for example, tungsten and molybdenum. The insulating layer OL is made of, for example, $SiO_2$. The number of the stacked word lines WL is arbitrary, and the insulating layers OL are disposed between the word lines WL having the arbitrary number of layers.

In the stacked body LS, a plurality of memory holes LMH is disposed as first memory holes extending in the stacked body LS in the stacking direction from the uppermost word line WL and reaching the p-well Wp of the substrate SUB.

A joint layer JL is disposed on the stacked body LS. The joint layer JL is formed of an insulating layer made of such as $SiO_2$. In the joint layer JL, a joint JT that joins and communicates the memory hole LMH and a memory hole UMH disposed in a stacked body US described below is disposed. The joint JT includes a joint JTx as a first joint and a joint JTy as a second joint.

The height of the joint JTx is substantially equal to the thickness of one set of the word line WL and the insulating layer OL of the stacked body LS, for example.

The inner wall surface of the joint layer JL in the joint JTx is formed of a plane continuous with the inner wall surface of the memory hole LMH. That is, the inner wall surface of the joint layer JL in the joint JTx and the inner wall surface of the memory hole LMH are on a continuous plane.

Further, a sidewall insulating layer SW is disposed on the inner wall surface of the joint layer JL in the joint JTx. The sidewall insulating layer SW is formed of an insulating layer made of such as $SiO_2$. By disposing the sidewall insulating layer SW, the joint JTx has a diameter smaller than a diameter of an upper end of the memory hole LMH. That is, the inner diameter of the sidewall insulating layer SW is smaller than the diameter of the upper end of the memory hole LMH.

The joint JTy is disposed on the joint JTx, and the height of the joint JTy is, for example, about twice the height of the joint JTx.

The joint JTy has a diameter larger than the diameter of a lower end of the memory hole UMH described later. The diameter of the joint JTy can be increased according to the density of the memory holes LMH disposed in the stacked body LSs such that the adjacent joints JTy do not interfere with each other physically or electrically.

A stacked body US as a second stacked body in which a plurality of word lines WL as conductive layers and a plurality of insulating layers OL are alternately stacked is disposed on the joint layer JL. The word line WL is made of at least one of, for example, tungsten and molybdenum. The insulating layer OL is made of, for example, $SiO_2$. The number of the stacked word lines WL is arbitrary, and the insulating layers OL are disposed between the word lines WL having the arbitrary number of layers.

In the stacked body LS, a plurality of the memory holes UMH is disposed as second memory holes extending from the uppermost word line WL in the stacked body LS in the stacking direction and joined to the joint JTy.

A memory layer ME that is a part of the memory cell MC is disposed on the sidewalls of the memory holes UMH and LMH. The memory layer ME may also be disposed at the joint JT. That is, the memory layer ME may be disposed on the top surface, sidewalls, and bottom surface of the joint JTy, and on the sidewall insulating layer SW of the joint JTx, that is, on the upper surface, side surface, and lower surface of the sidewall insulating layer SW.

The memory layer ME has a configuration in which a block insulating layer A, a charge storage layer B, and a tunnel insulating layer C are stacked in order from the inner wall surface side of the memory holes UMH and LMH. The block insulating layer A and the tunnel insulating layer C are made of, for example, $SiO_2$. The charge storage layer B is made of, for example, SiN.

A channel layer CN is disposed on the tunnel insulating layer C of the memory layer ME. The channel layer CN preferably extends without interruption from the memory hole UMH to the joint layer JT and further to the memory hole LMH. The channel layer CN is also disposed on the bottom surface of the memory hole LMH where the memory layer ME is not disposed. Thereby, the channel layer CN is connected to the p-well Wp of the substrate SUB that functions as a source line.

The core layers CR are filled inside the channel layers CN of the memory holes UMH and LMH and the joint JT. The core layer CR is made of, for example, $SiO_2$.

The memory holes UMH and LMH, the joint JT, the memory layer ME, the channel layer CN, and the core layer CR form a pillar PL that extends in the stacked bodies US and LS in the stacking direction.

An interlayer insulating layer ILa is disposed on the stacked body US, and an interlayer insulating layer ILb is disposed on the interlayer insulating layer ILa. A contact CH penetrating the interlayer insulating layer ILa connects the channel CN of the pillar PL and a bit line BL as an upper layer wiring disposed in the interlayer insulating layer ILb.

With the above configuration, a plurality of the memory cells MC arranged in the height direction of the pillar PL is formed at the intersection between the pillar PL and each word line WL. By applying a predetermined voltage from the word line WL to the corresponding memory cell MC, data is written in the memory cell MC by storing charges in the charge storage layer B of the memory cell MC. Further, by applying a predetermined voltage from the word line WL to the corresponding memory cell MC, the data stored in the memory cell MC is read out to the bit line BL.

Note that at least the uppermost word line WL and the lowermost word line WL function as selection gate lines. A selection transistor is formed in place of the memory cell MC at the intersection of the selection gate line and the pillar PL. When the selection transistor is turned on or off, the memory cell MC of the pillar PL to which the selection transistor belongs is selected or not selected.

Further, the channel layer CN at the bottom of the memory hole LMH is directly connected to the substrate SUB. However, the channel layer CN may be connected to the substrate SUB via an epitaxial layer formed of such as silicon grown from the substrate SUB. Further, a source line or the like may be interposed between the substrate SUB and the stacked body LS, and the channel layer CN may be directly or indirectly connected to the source line.

In addition, the vertical direction in the semiconductor memory device 1 of the first embodiment is defined based on the shape of the joint JT. Specifically, in the semiconductor memory device 1, the side on which the joint JTx having a small diameter is disposed is the lower side, and the side on which the joint JTy having a large diameter is disposed is the upper side.

Method of Manufacturing Semiconductor Memory Device

Next, a method of manufacturing the semiconductor memory device 1 according to the first embodiment will be described with reference to FIGS. 2A to 8B. FIGS. 2A to 8B are flowcharts illustrating an example of a procedure of a method of manufacturing the semiconductor memory device 1 according to the first embodiment. Note that, in FIGS. 2A to 8B, the lower layer structure of the semiconductor memory device 1 is indicated as a base layer UL.

Figure 2A:
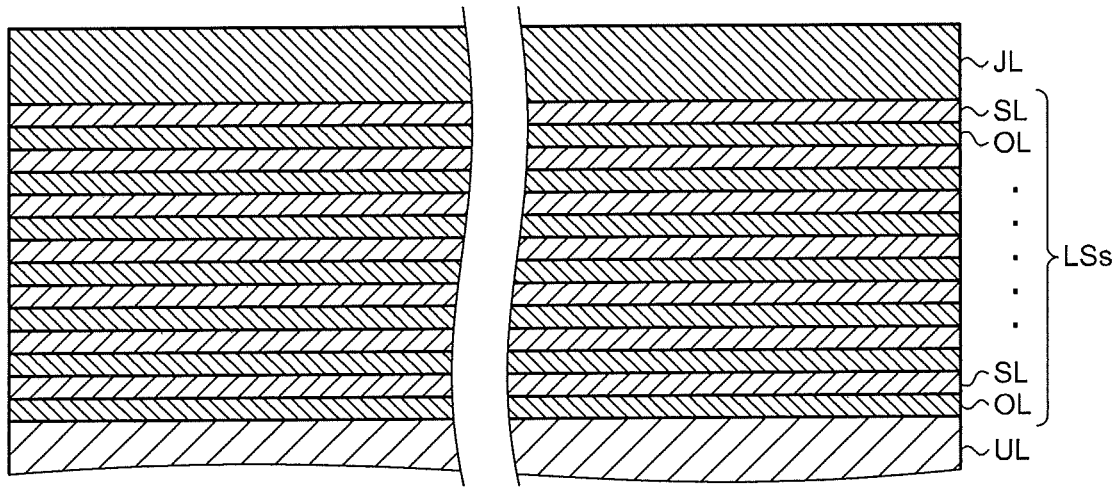
FIGS. 2A to 2C are flowcharts illustrating an example of a procedure of a manufacturing method of the semiconductor memory device according to the first embodiment.

As illustrated in FIG. 2A, the stacked body LSs in which a plurality of sacrificial layers SL as insulating layers and a plurality of the insulating layers OL are alternately stacked is formed on the base layer UL such as the substrate SUB (refer to FIG. 1). The sacrificial layer SL is a layer that becomes the word line WL in a replacement process described later, and the sacrificial layer SL is formed of, for example, SiN that can be replaced with a conductor.

Further, the joint layer JL is formed on the stacked body LSs.

Figure 2B:
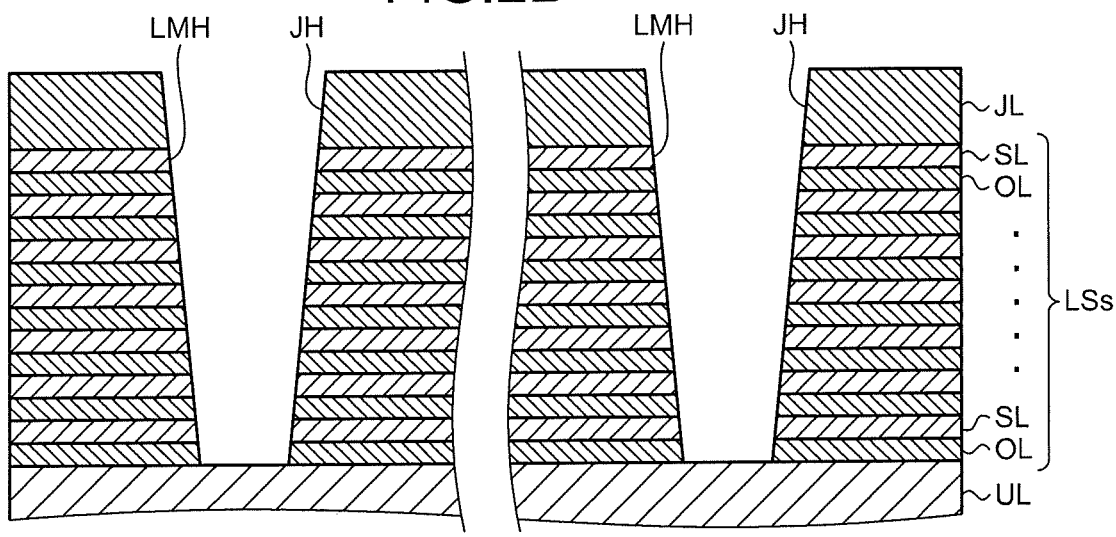

As illustrated in FIG. 2B, a plurality of through holes that penetrates the joint layer JL and the stacked body LSs and reaches the base layer UL is formed. Of the formed through holes, a portion that penetrates the joint layer JL is a joint hole JH, and a portion that penetrates the stacked body LSs is the memory hole LMH.

Figure 2C:
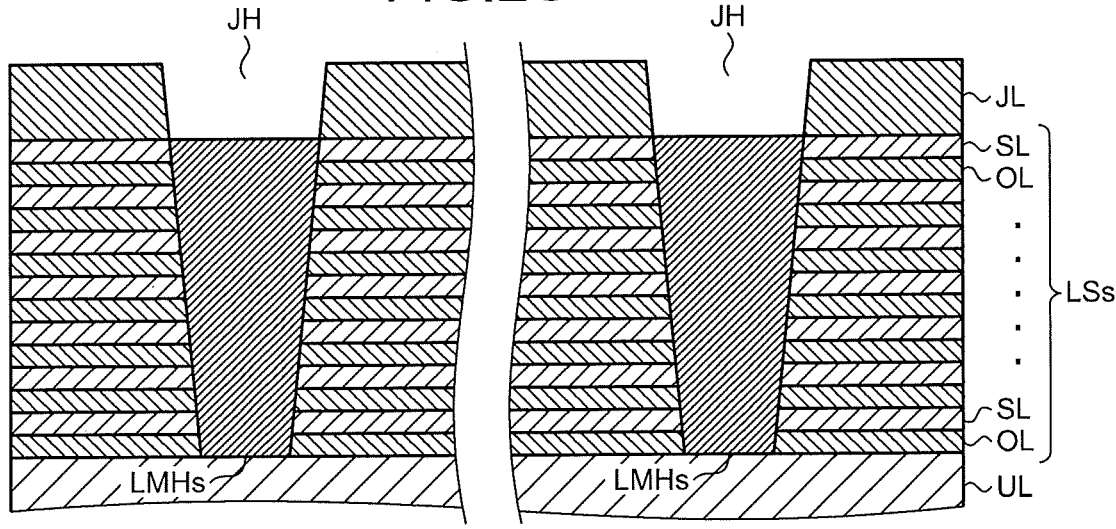

As illustrated in FIG. 2C, each memory hole LMH is filled with a sacrificial layer formed of such as α-Si, and columnar portions LMHs filled with the sacrificial layer are formed. By filling the memory hole LMH with the sacrificial layer, the subsequent steps can be performed without affecting the memory hole LMH.

The sacrificial layer is buried up to the upper end of the memory hole LMH, that is, up to the boundary between the stacked body LSs and the joint layer JL. In this way, in order to bury the sacrificial layer, for example, the sacrificial layer may be formed on the entire surface of the joint layer JL including the inside of the memory hole LMH, and the sacrificial layer excluding the inside of the memory hole LMH may be removed by etching back or the like.

Figure 3A:
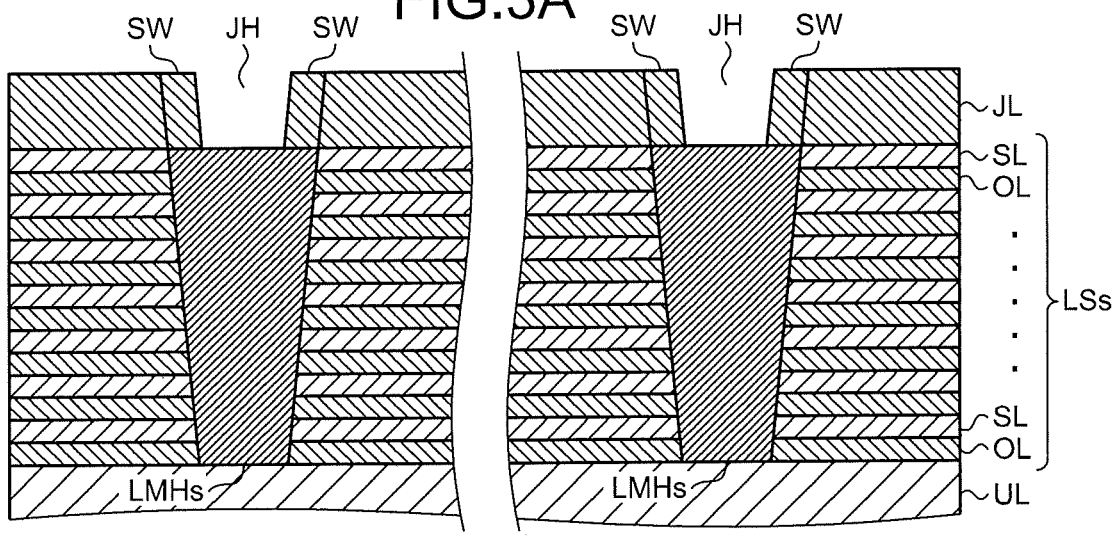
FIGS. 3A to 3C are flowcharts illustrating an example of a procedure of a manufacturing method of the semiconductor memory device according to the first embodiment.

As illustrated in FIG. 3A, an insulating layer such as $SiO_2$ is formed on the entire surface of the joint layer JL including the inside of the joint hole JH and etched back, such that the sidewall insulating layer SW is formed on the inner wall surface of the joint layer JL. At this time, by making the etch-back condition anisotropic, the insulating layers on the upper surface of the joint layer JL and on the upper surface of the columnar portion LMHs can be removed while leaving the sidewall insulating layer SW.

Figure 3B:
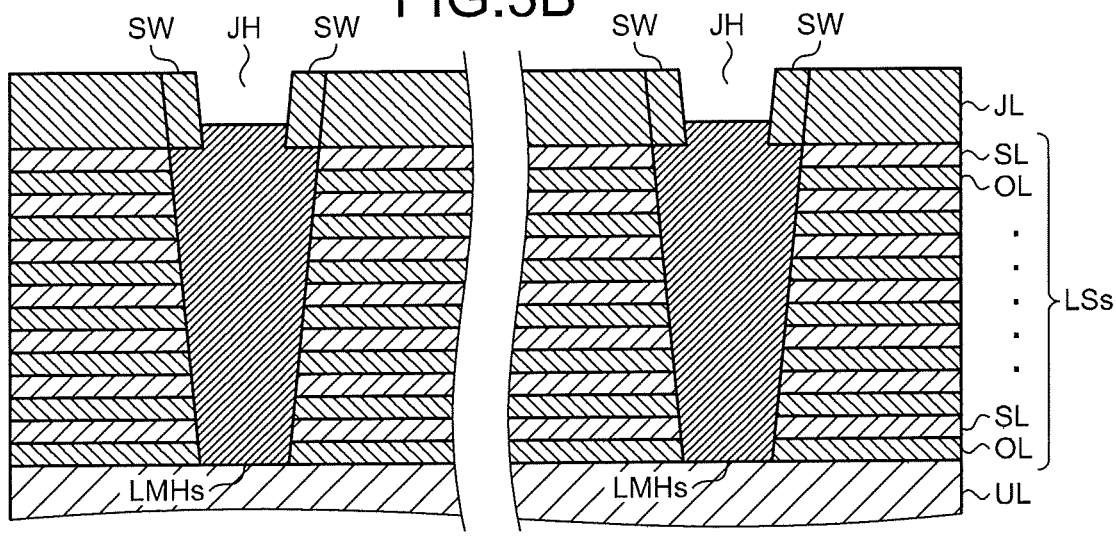

As illustrated in FIG. 3B, a sacrificial layer formed of such as α-Si is formed on the entire surface of the joint layer JL including the inside of the joint hole JH and etched back, such that the sacrificial layer is filled up to the middle of the joint hole JH. The height of the protrusion of the sacrificial layer protruding from the memory hole LMH to the joint hole JH is substantially equal to the thickness of one set of the sacrificial layer SL and the insulating layer OL of the stacked body LSs, for example.

Figure 3C:
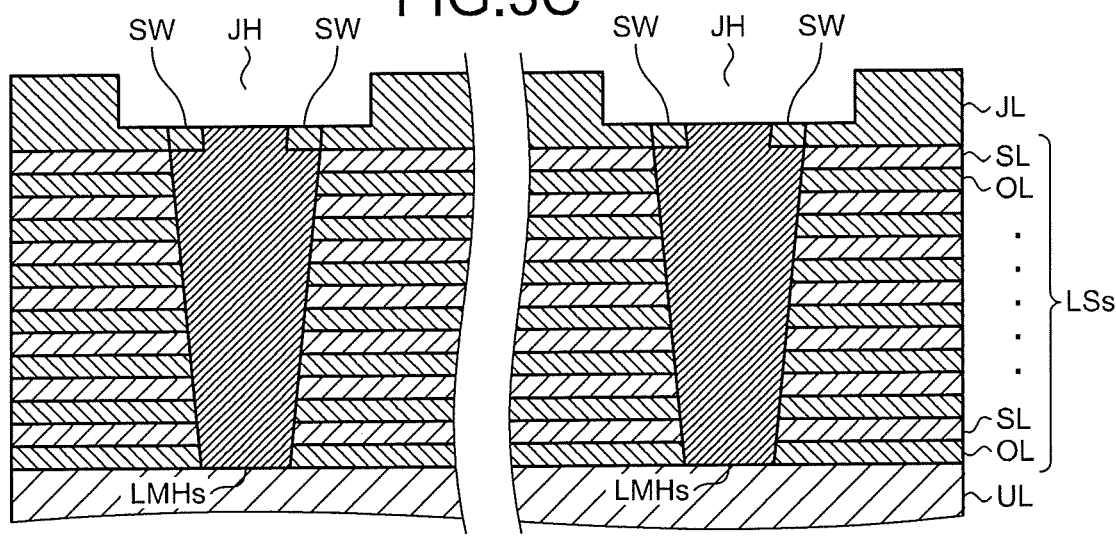

As illustrated in FIG. 3C, by DHF (dilute hydrogen fluoride solution) or the like, the sidewall insulating layer SW and the joint layer JL exposed from the upper end of the columnar portion LMHs are selectively wet etched, and the diameter of the upper part of the joint hole JL except for a portion where the sacrificial layer protrudes is enlarged. The thickness of the enlarged portion of the joint hole JH is about twice the protrusion height of the sacrificial layer protruding into the joint hole JH.

Figure 4A:
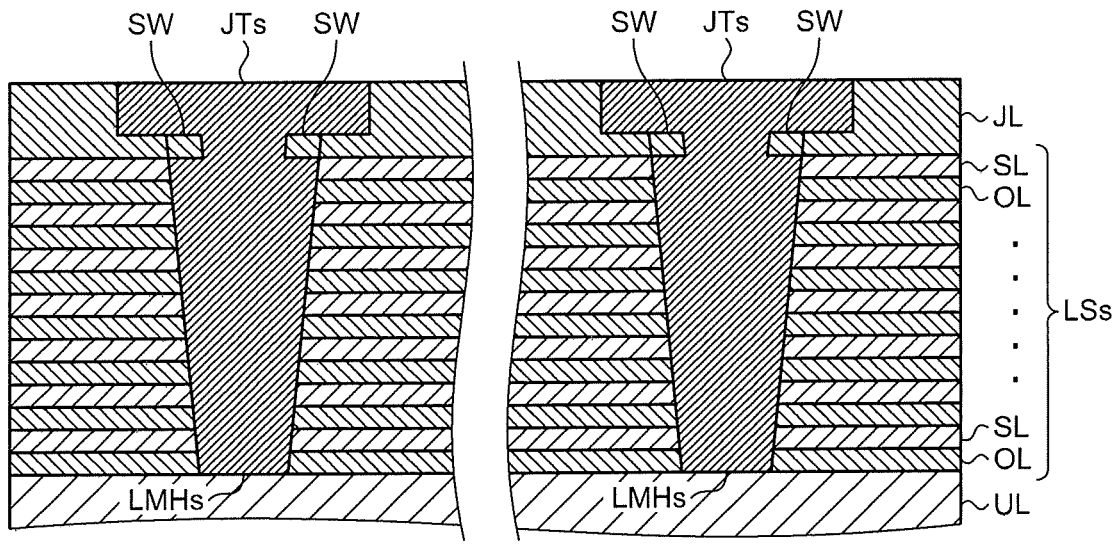
FIGS. 4A and 4B are flowcharts illustrating an example of a procedure of a manufacturing method of the semiconductor memory device according to the first embodiment.

As illustrated in FIG. 4A, by forming and etching back a sacrificial layer formed of such as α-Si on the entire surface of the joint layer JL including the inside of the enlarged joint hole JH, the sacrificial layer is filled up to the upper end of the joint hole JH to form a joint JTs filled with the sacrificial layer.

Figure 4B:
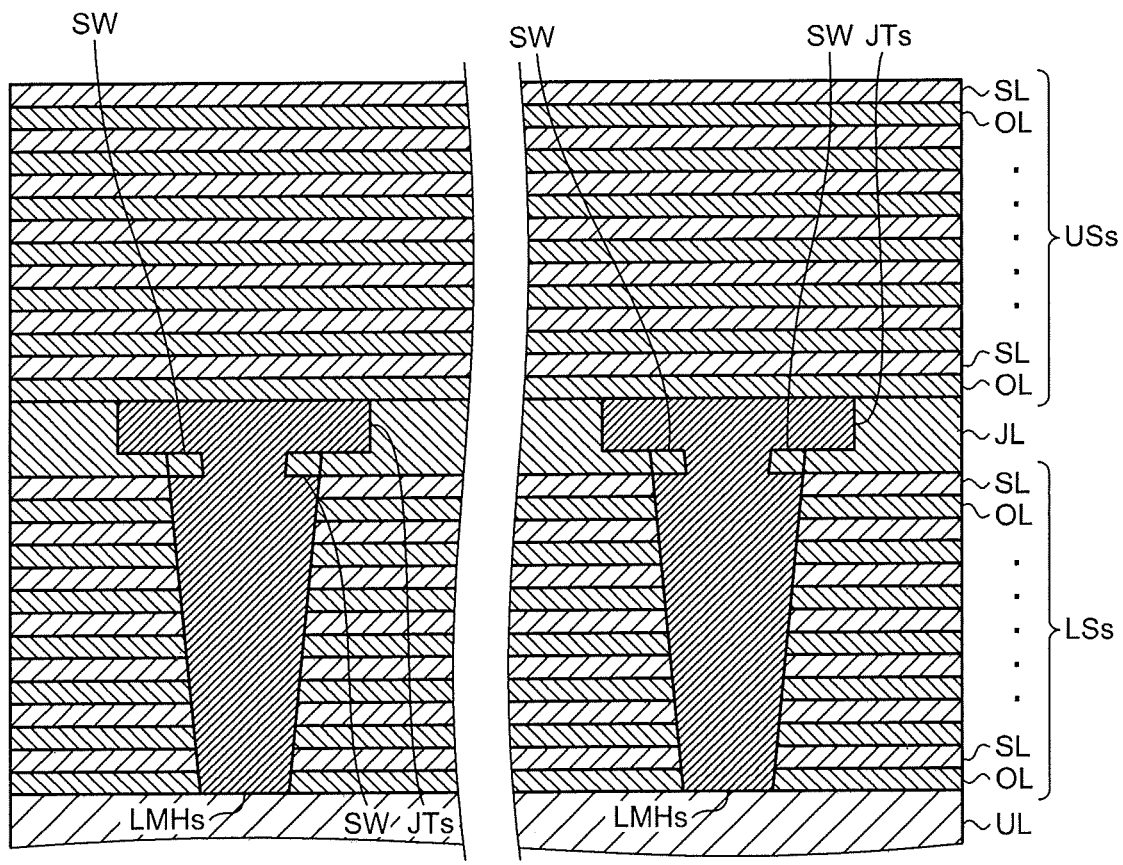

As illustrated in FIG. 4B, the stacked body USs in which a plurality of the sacrificial layers SL and a plurality of the insulating layers OL are alternately stacked is formed on the entire surface of the joint layer JL. At this time, it is suppressed that the sacrificial layer SL and the insulating layer OL are formed in the memory hole LMH and the joint hole JH filled with the sacrificial layer formed of such as α-Si.

Figure 5A:
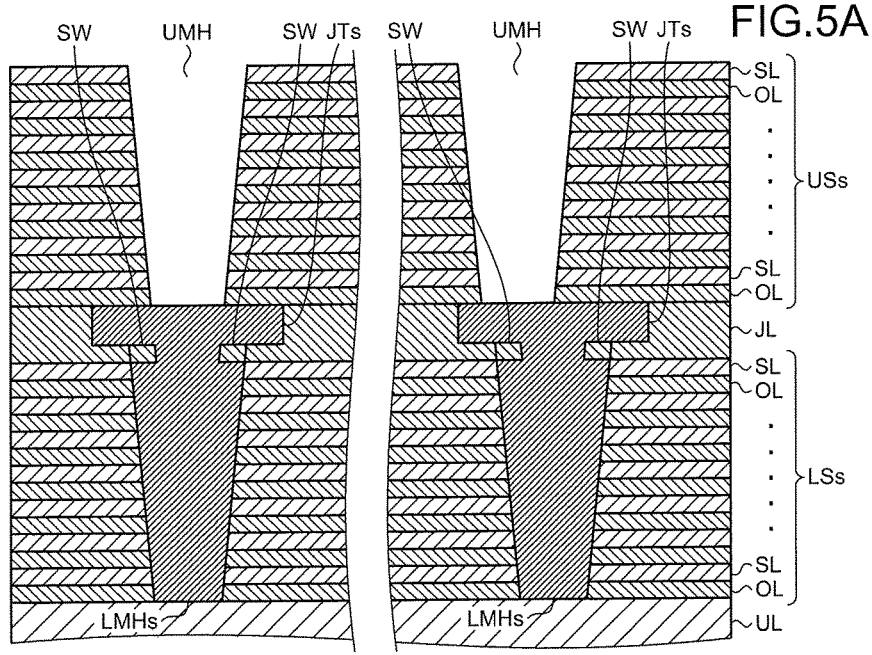
FIGS. 5A and 5B are flowcharts illustrating an example of a procedure of a manufacturing method of the semiconductor memory device according to the first embodiment.

As illustrated in FIG. 5A, a plurality of the memory holes UMH penetrating the stacked body USs and reaching the joint JTs are formed. The upper part of the joint JTs is enlarged in diameter so as to have a diameter at least larger than the bottom surface of the memory hole UMH. Therefore, for example, as illustrated on the right side of FIG. 5A, even if the formation position of the memory hole UMH slightly deviates from the position immediately above the memory hole LMH due to misalignment in the lithography process, the memory hole UMH can be more reliably joined to the joint JTs. In this way, the enlarged joint JTs functions as a pedestal for the memory hole UMH.

Figure 5B:
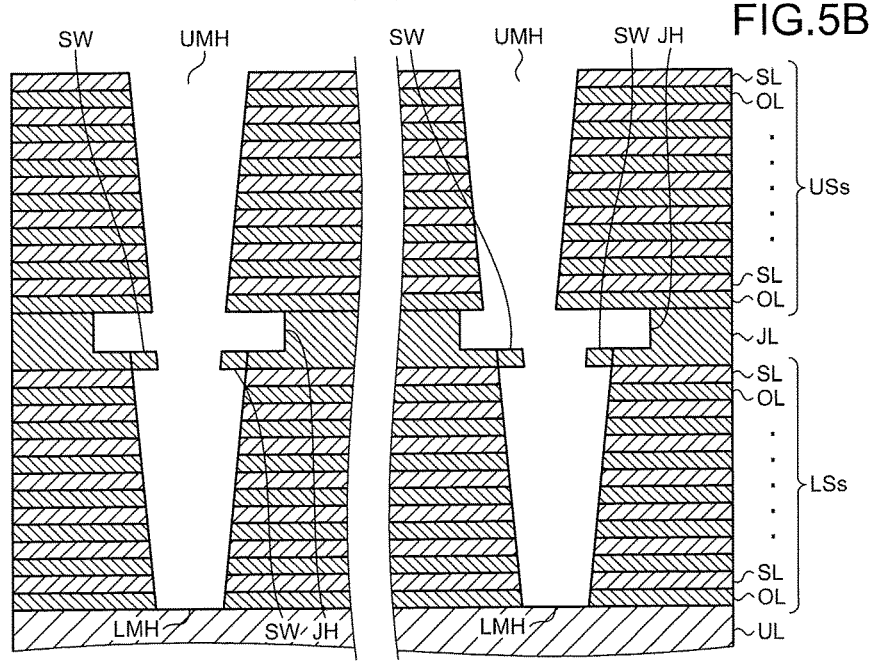

As illustrated in FIG. 5B, the sacrificial layers in the joint hole JH and the memory hole LMH are removed through the opened memory hole UMH.

Figure 6A:
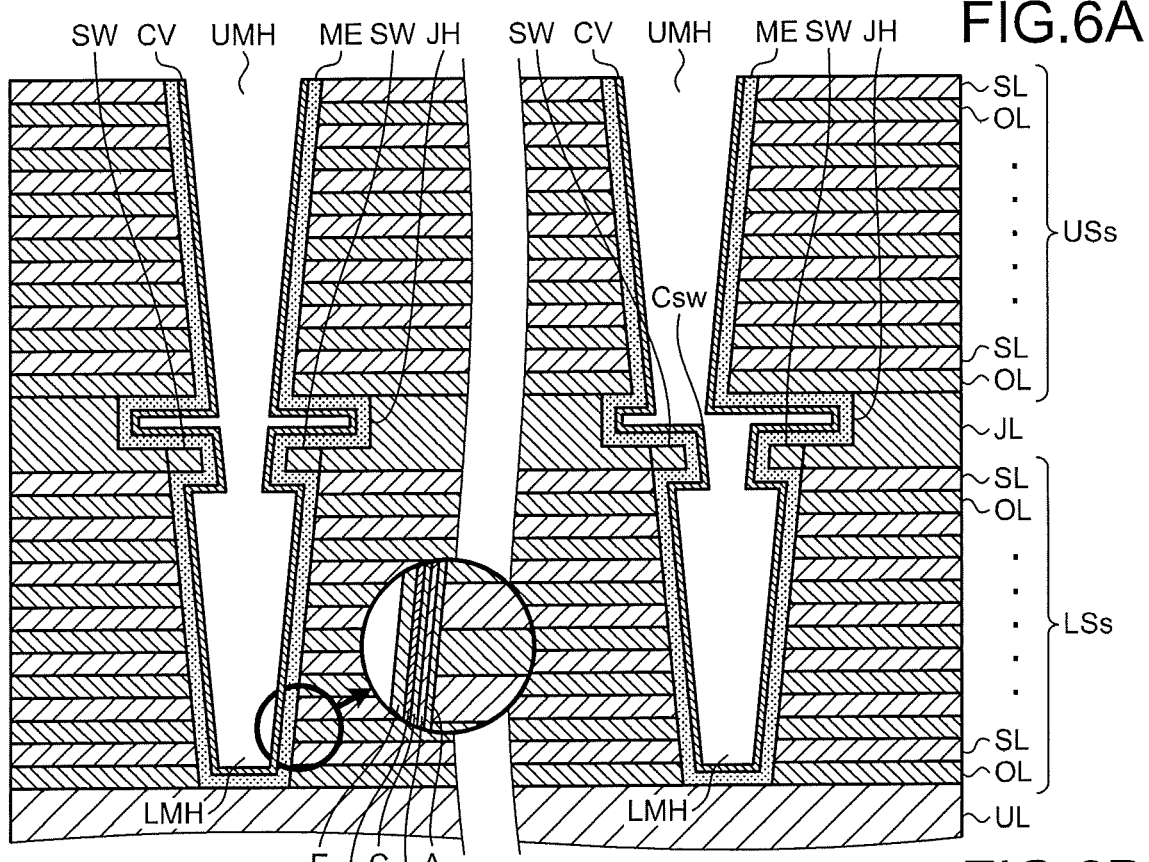
FIGS. 6A and 6B are flowcharts illustrating an example of a procedure of a manufacturing method of the semiconductor memory device according to the first embodiment.

As illustrated in FIG. 6A, the memory layer ME is formed on these inner wall surfaces from the upper end of the memory hole UMH to the bottom surface of the memory hole LMH through the joint hole JH. More specifically, the block insulating layer A, the charge storage layer B, and the tunnel insulating layer C are formed in this order from the inner wall surface side of the memory hole UMH, the joint hole JH, and the memory hole LMH.

Further, a protective layer CV is formed on the tunnel insulating layer C of the memory layer ME. The protective layer CV includes, for example, an α-Si layer D on the tunnel insulating layer C, an $SiO_2$ layer E on the α-Si layer D, and the like.

Here, there is the case where a corner Csw of the sidewall insulating layer SW covered with the memory layer ME and the protective layer CV protrudes from the hole bottom of the memory hole UMH that is misaligned with the memory hole LMH.

Figure 6B:
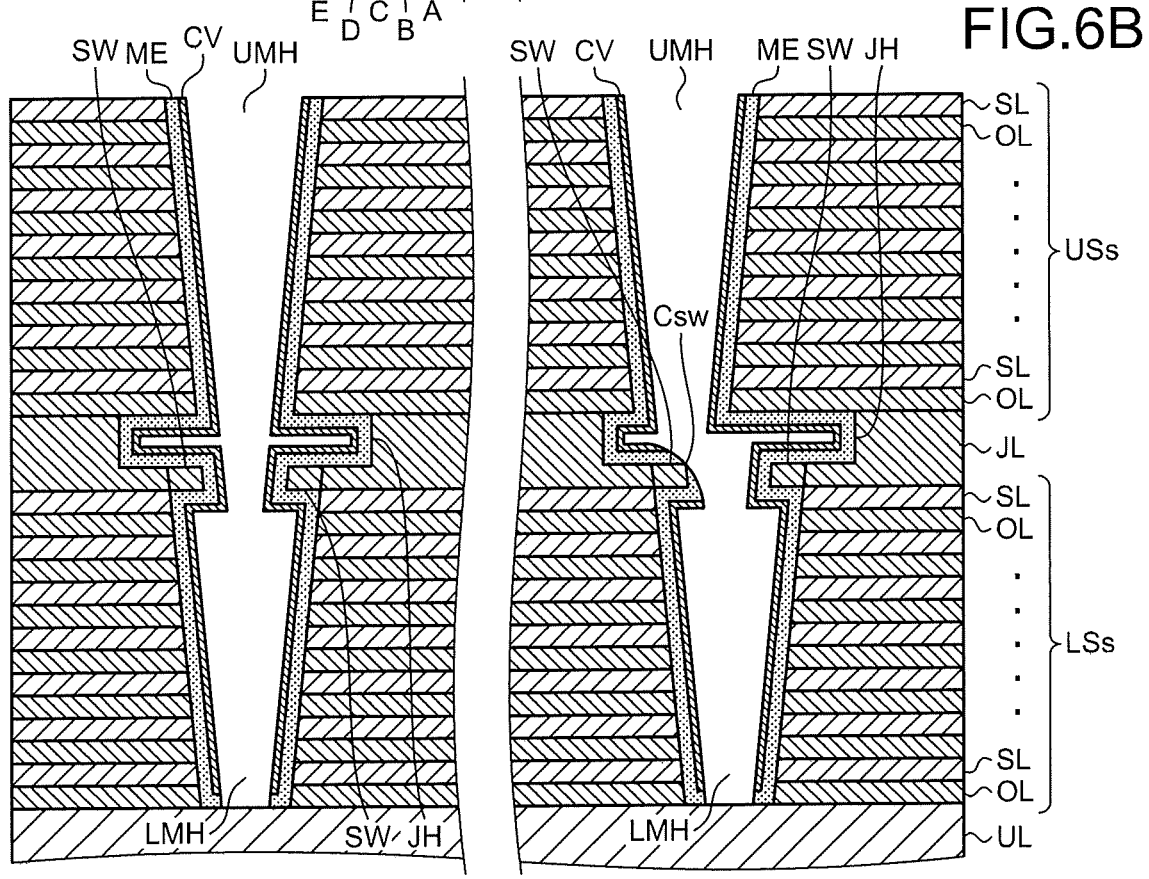

As illustrated in FIG. 6B, the protective layer CV and the memory layer ME on the bottom surface of the memory hole LMH are removed. The protective layer CV and the memory layer ME on the bottom surface of the memory hole LMH can be removed through the memory hole UMH, the joint hole JH, and the memory hole LMH by dry etching using a fluorocarbon gas.

In dry etching using a fluorocarbon gas, radicals such as fluorocarbon adhere to the surface of the protective layer CV or the memory layer ME to be etched, and the etching is promoted with the assistance of ion impact by such as fluorine ions.

Radicals of such as fluorocarbons adhere to the surfaces of the protective layer CV and the memory layer ME on the sidewalls of the memory holes UMH and LMH that are not to be etched, but the radicals are not easily subjected to ion impact by fluorine ions that travel straight toward the bottom of the hole. Therefore, the etching hardly proceeds on the sidewalls of the memory holes UMH and LMH, and the protective layer CV and the memory layer ME on the bottom surface of the memory hole LMH are selectively etched.

Further, in the memory hole UMH misaligned with the memory hole LMH, not only the bottom of the memory hole LMH, but also the corner Csw of the sidewall insulating layer SW protruding into the hole bottom of the memory hole UMH is exposed to ion attack by such as fluorine ions. Therefore, the protective layer CV and the memory layer ME of the sidewall insulating layer SW may be removed in a partial region. In addition, the exposed sidewall insulating layer SW itself may be partially etched to be in a state such that a shoulder falls.

However, the sidewall of the memory hole LMH below the sidewall insulating layer SW is protected by the sidewall insulating layer SW, and the etching of the protective layer CV and the memory layer ME is suppressed.

Figure 7A:
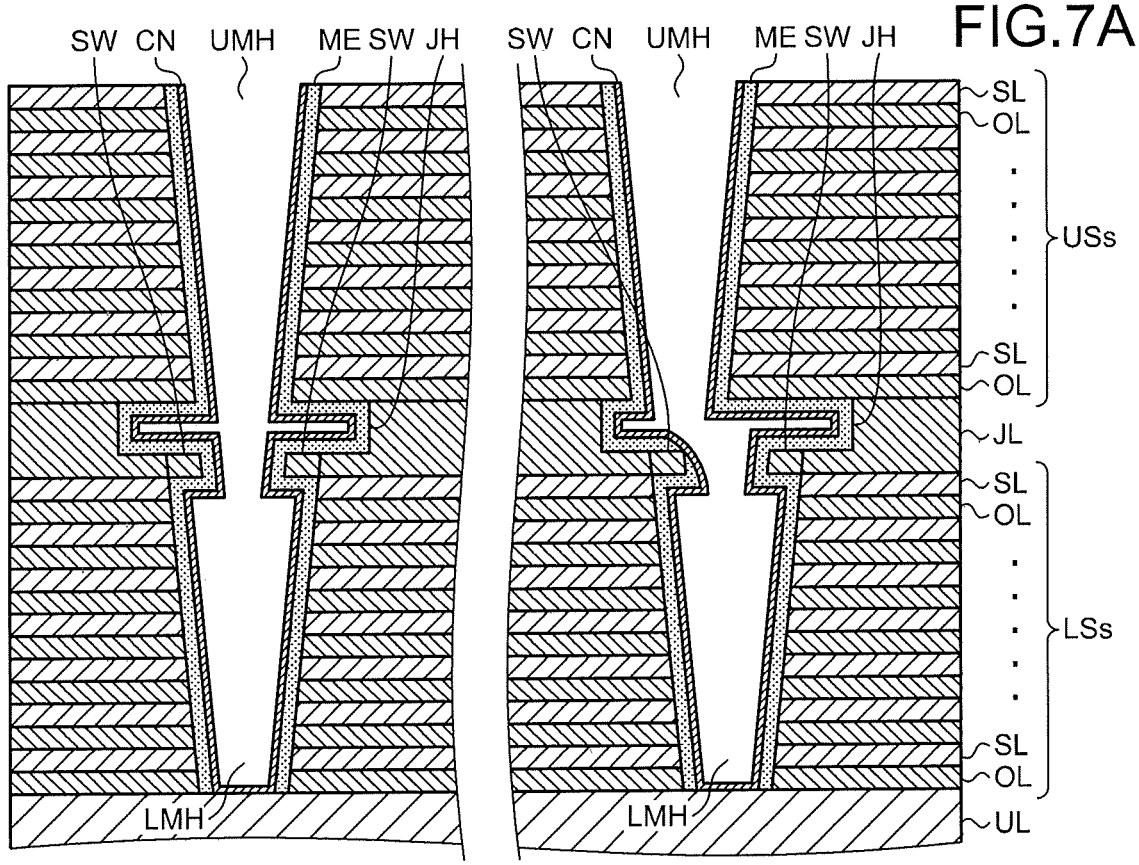
FIGS. 7A and 7B are flowcharts illustrating an example of a procedure of a manufacturing method of the semiconductor memory device according to the first embodiment.

As illustrated in FIG. 7A, after the protective layer CV on the memory layer ME is removed, the channel layer CN is formed on the inner wall surface from the upper end of the memory hole UMH, through the joint hole JH, to the bottom surface of the memory hole LMH.

Here, it is obvious that, at the portion where the memory layer ME remains, such as the sidewalls of the memory holes UMH and LMH, the memory layer ME is interposed between the inner wall surfaces of the memory holes UMH and LMH and the channel layer CN. Further, in the portion where the memory layer ME on the bottom surface of the memory hole LMH is removed, the channel layer CN is formed directly on the exposed base layer UL. Further, for example, the channel layer CN is formed directly on the sidewall insulating layer SW at the portion where the sidewall insulating layer SW or the like is exposed at the bottom of the misaligned memory hole UMH.

Figure 7B:
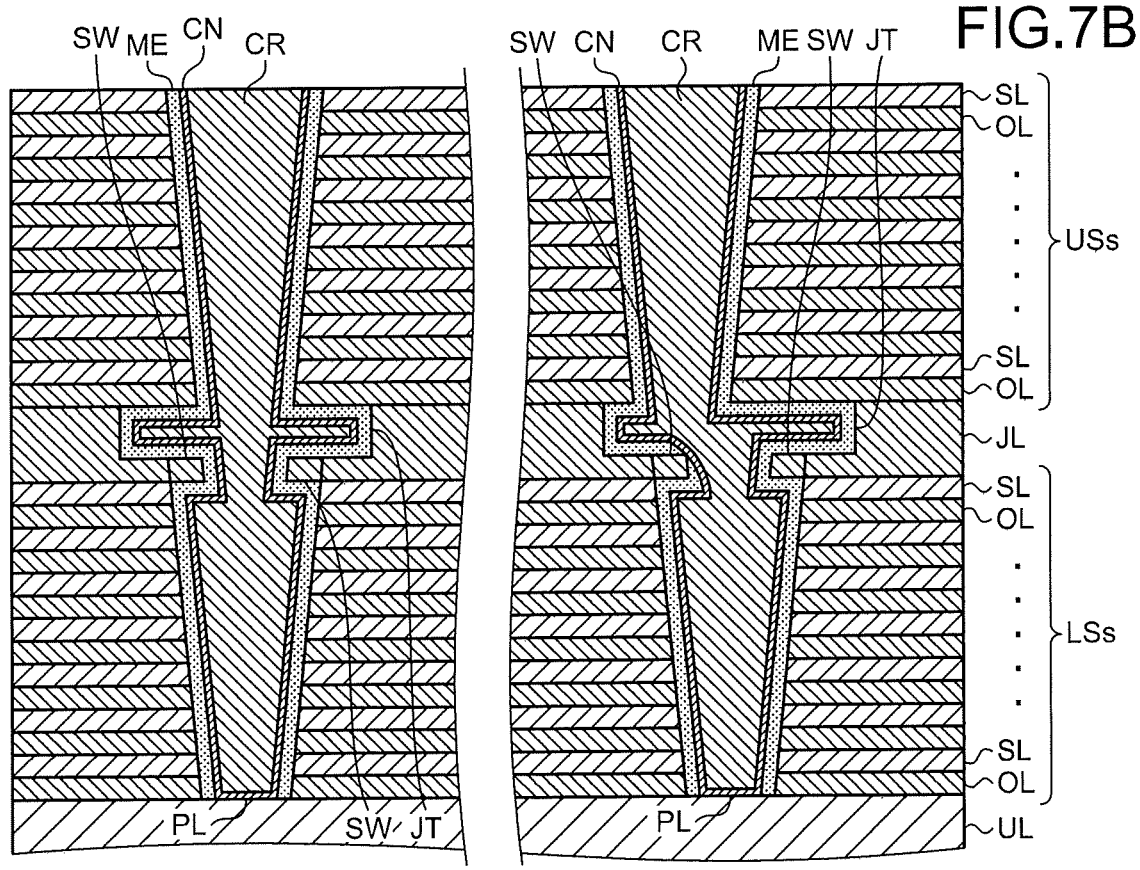

As illustrated in FIG. 7B, a space further inside the channel layer CN in the memory hole UMH, the joint hole JH, and the memory hole LMH is filled with an insulating layer to form the core layer CR.

As a result, the joint JT having the joints JTx and JTy filled with a predetermined material is formed. Further, the pillar PL having the joint JT is formed between the memory holes LMH and UMH filled with a predetermined material.

Figure 8A:
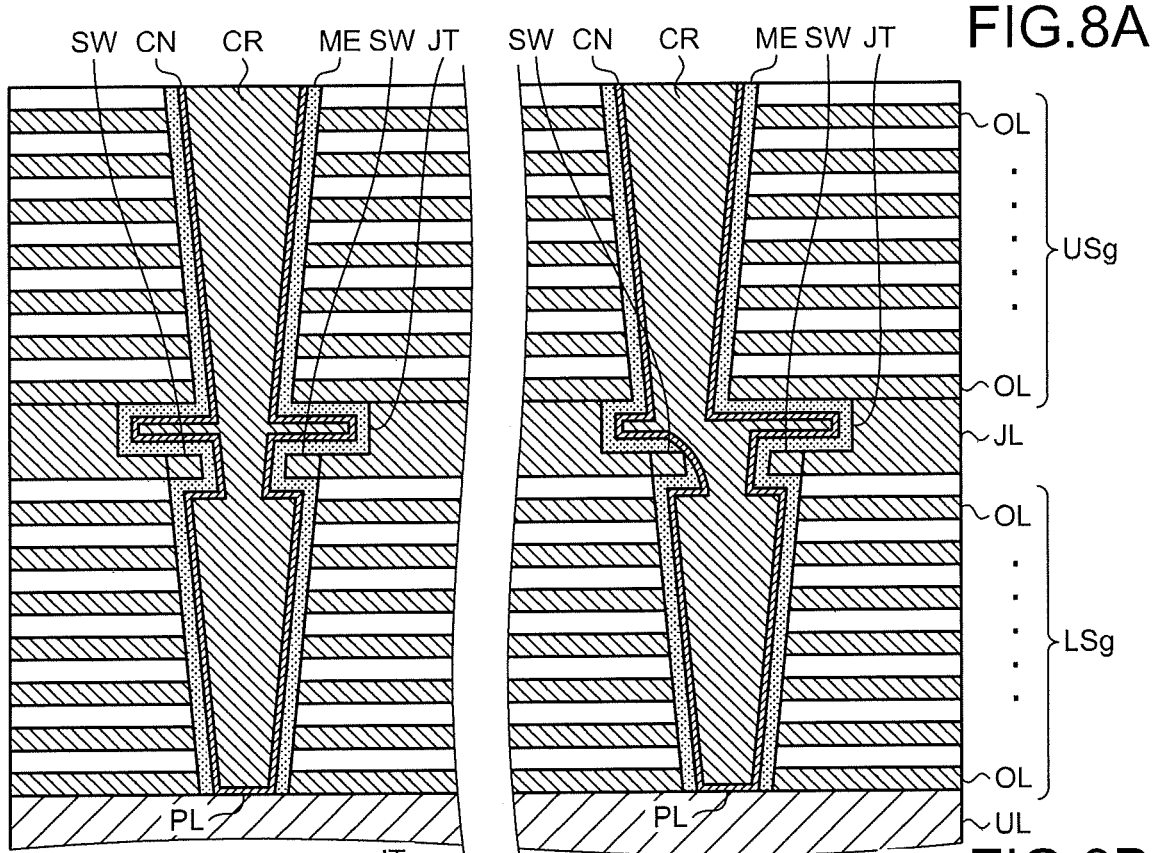
FIGS. 8A and 8B are flowcharts illustrating an example of a procedure of a manufacturing method of the semiconductor memory device according to the first embodiment.

As illustrated in FIG. 8A, the sacrificial layer SL between the insulating layers OL is removed. The removal of the sacrificial layer SL is performed by forming a slit (not illustrated) that penetrates the stacked body USs, the joint layer JL, and the stacked body LSs and reaches the base layer UL, and by using a chemical solution such as hot phosphoric acid through the slit. Thereby, stacked bodies USg and LSg having a gap between the insulating layers OL are formed.

Figure 8B:
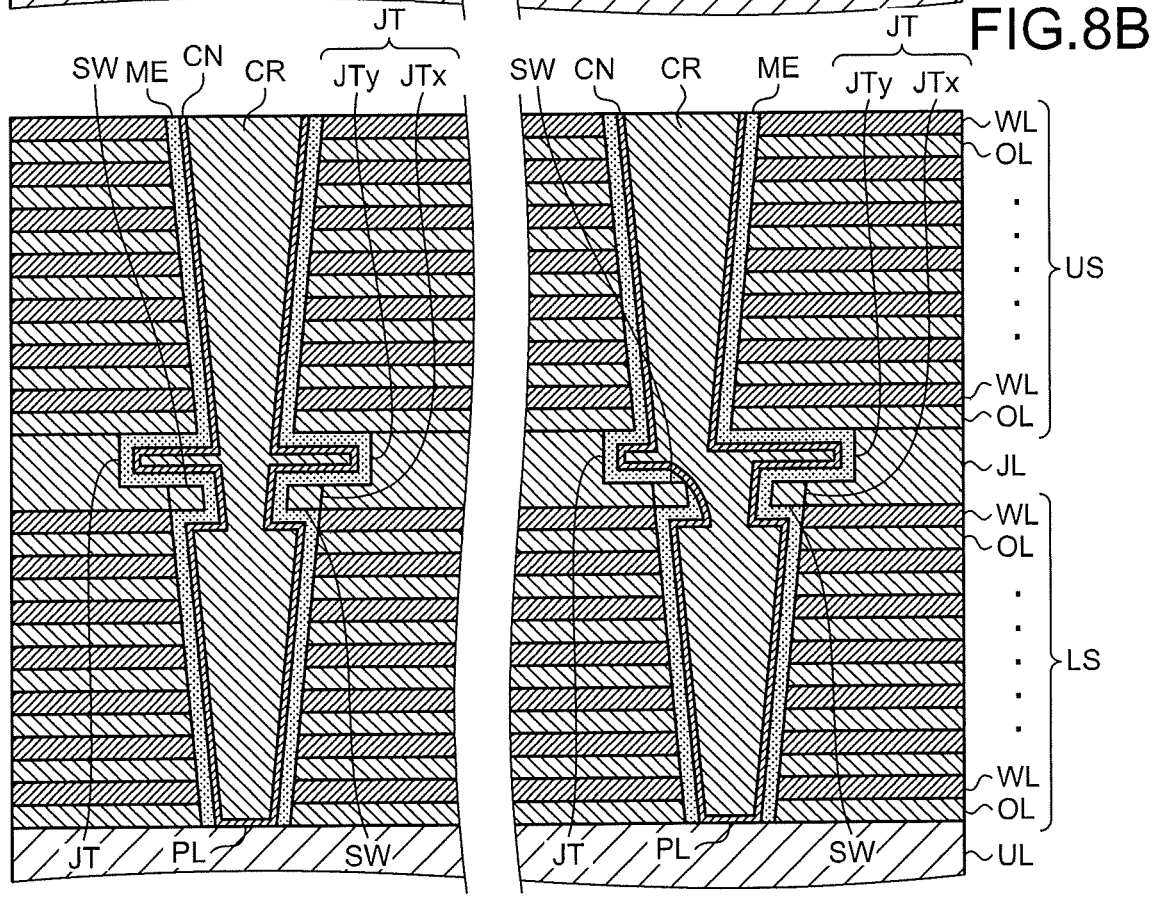

As illustrated in FIG. 8B, the gap between the stacked bodies USg and LSg is filled with a conductive material, and the word lines WL are formed between a plurality of the insulating layers OL. Thus, the stacked bodies US and LS are formed in which a plurality of the word lines WL and a plurality of the insulating layers OL are alternately stacked.

Note that the process illustrated in FIGS. 8A and 8B may be referred to as "replacement".

Thereafter, as illustrated in FIG. 1 described above, the interlayer insulating layer ILa is formed on the stacked body US, and a contact CH that penetrates the interlayer insulating layer ILa is formed. Further, the interlayer insulating layer ILb is formed on the interlayer insulating layer ILa, and the bit line BL is formed in the interlayer insulating layer ILb.

As described above, the semiconductor memory device 1 of the first embodiment is manufactured.

Comparative Example

In a method of manufacturing a semiconductor memory device in the comparative example, the diameter of the upper part of a joint hole JH' is increased without forming the sidewall insulating layer SW on the inner wall surface of the joint layer JL. As a result, the inner wall surface below the joint hole JH' and the inner wall surface at the upper end of a memory hole LMH' is a continuous plane. FIG. 9A illustrates a state in which such the joint hole JH' is disposed between the memory holes LMH' and UMH', and further, a memory layer ME' and a protective layer CV' are formed on the inner wall surfaces of the memory holes LMH' and UMH' and the like.

As illustrated in FIG. 9A, a corner Cjh below the joint hole JH' covered with the memory layer ME' and the protective layer CV' protrudes at the hole bottom of the memory hole UMH' that is misaligned with the memory hole LMH'. As illustrated in FIG. 9B, when the protective layer CV' and the memory layer ME' on the bottom surface of the memory hole LMH' is removed, a part or all of the protective layer CV' and the memory layer ME' around the corner Cjh below the joint hole JH' may be removed. When the memory layer ME' is removed until the stacked body LSs portion, the portion does not function as the memory cell MC.

As described above, in the etching removal of the protective layer CV' and the memory layer ME', etching is promoted with the adherence of the fluorocarbon radicals to the surface to be etched and the assistance of ion impact by such as fluorine ions and the like. For example, in order to protect around the corner Cjh under the joint hole JH' including the memory hole LMH' sidewall, it is also conceivable to adhere to a large amount of fluorocarbon radicals to the surfaces of the protective layer CV' and the memory layer ME' and form a protective layer made of fluorocarbon polymer or the like.

However, such a protective layer also adheres to the bottom of the memory hole LMH', and the etching of the protective layer CV' and the memory layer ME' on the bottom surface is blocked. Thus, the protection of the sidewall of the memory hole LMH' and the detachability at the bottom surface of the memory hole LMH' are in a trade-off relationship. Even if the removal process for the protective layer CV' and the memory layer ME' on the bottom surface of the memory hole LMH' is constructed in such a window, a process with a narrow margin is constructed.

Figure 10A:
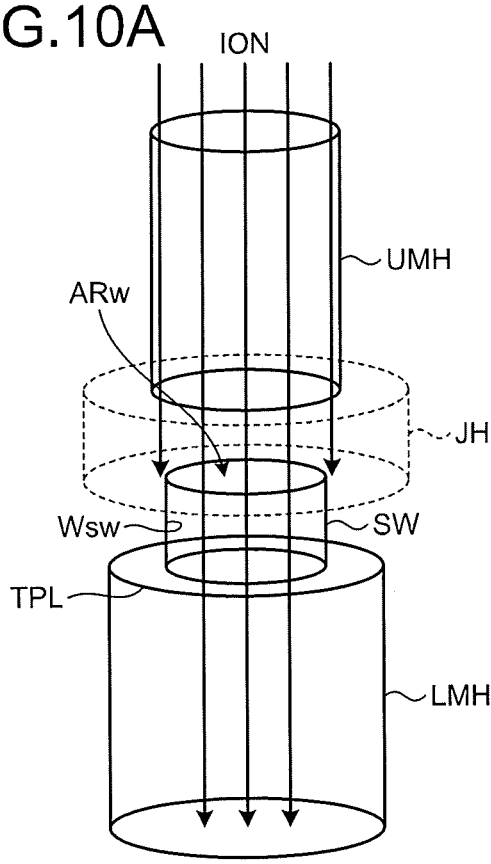
FIGS. 10A to 10D are perspective views illustrating a state in which a memory layer on a bottom surface of a memory hole is removed in the semiconductor memory device according to the first embodiment and the comparative example.
Figure 10B:
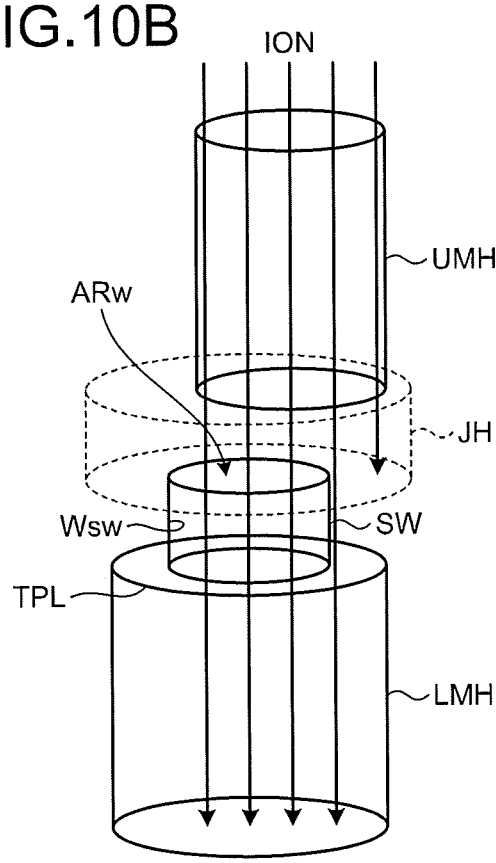

FIGS. 10A to 10D are perspective views illustrating a state in which a memory layer on a bottom surface of a memory hole is removed in the semiconductor memory device according to the first embodiment and the comparative example;

FIG. 10A is a perspective view of the memory hole UMH, the joint hole JH, and the memory hole LMH of the first embodiment, and FIG. 10B is a perspective view of the memory hole UMH, the joint hole JH, and the memory hole LMH in which misalignment occurs in the first embodiment.

Figure 10C:
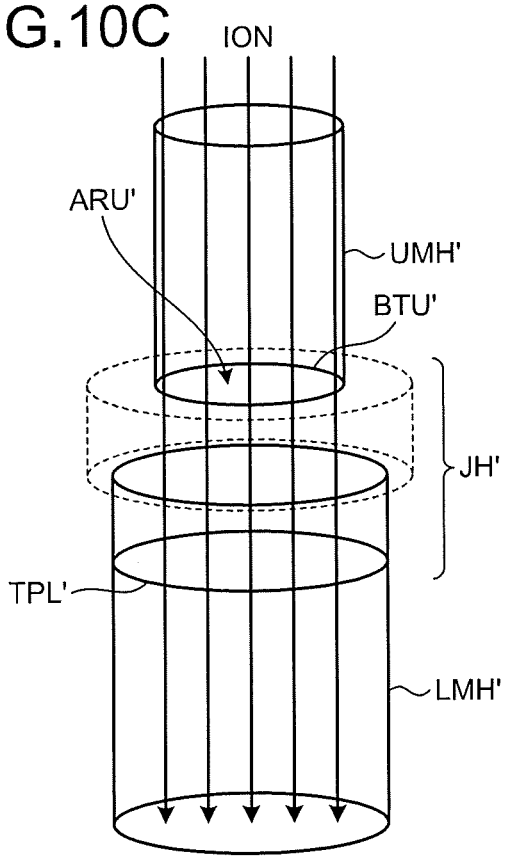
Figure 10D:
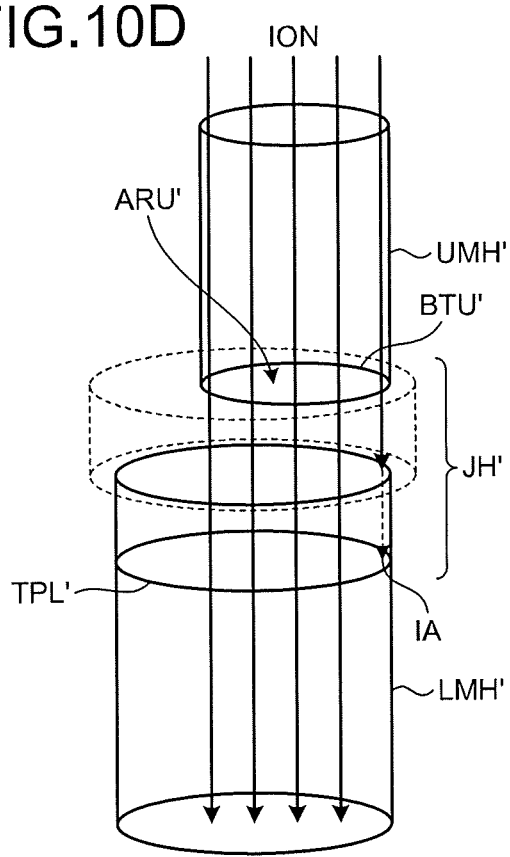

FIG. 10C is a perspective view of the memory hole UMH', the joint hole JH', and the memory hole LMH' of the comparative example, and FIG. 10D is a perspective view of the memory hole UMH', the joint hole JH', and the memory hole LMH' in which misalignment occurs in the comparative example.

As illustrated in FIG. 10C, when no misalignment occurs in the semiconductor memory device of the comparative example, the upper edge TPL' of the memory hole LMH' is disposed outside the area ARU' partitioned by the lower edge BTU' of the memory hole UMH' when viewed from the top, and ion attack on the upper edge TPL' of the memory hole LMH' is suppressed. However, as illustrated in FIG. 10D, when the misalignment occurs in the semiconductor memory device of the comparative example, a part of the upper edge TPL' of the memory hole LMH' is disposed inside the area ARU' partitioned by the lower edge BTU' of the memory hole UMH' when viewed from the top. Therefore, the part can be subjected to ion attack IA.

As illustrated in FIGS. 10A and 10B, in the semiconductor memory device 1 of the first embodiment, the upper edge TPL of the memory hole LMH is disposed outside an area ARw partitioned by an inner wall Wsw of the sidewall insulating layer SW formed in the joint hole JH when viewed from the top, regardless of whether or not there is a misalignment. That is, from the memory hole UMH side, the upper edge TPL of the memory hole LMH cannot be visually recognized by being blocked by the sidewall insulating layer SW.

Therefore, ions that travel substantially straight from the memory hole UMH side toward the hole bottom of the memory hole LMH are prevented from attacking the upper edge of the memory hole LMH by being blocked by the sidewall insulating layer SW.

As described above, the sidewall insulating layer SW has a function as a self-alignment mask disposed in a self-aligned manner with respect to the memory hole LMH.

Now that when the memory holes LMH and UMH are formed, the memory holes LMH and UMH may be formed inclined with respect to the stacking direction of the stacked bodies LSs and USs due to the inclination of ions. Even in such a case, the memory layer ME on the sidewall of the memory hole LMH can be prevented from being removed by etching by the function of the sidewall insulating layer SW.

As described above, the semiconductor memory device 1 of the first embodiment has the following effects.

According to the semiconductor memory device 1 of the first embodiment, the sidewall insulating layer SW is disposed on the inner wall surface of the joint JTx configured by a plane continuous with the inner wall surface of the memory hole LMH. Thereby, etching of the memory layer ME on the sidewall of the memory hole LMH is suppressed. Therefore, it is suppressed that part or all of the memory layer ME on the sidewall of the memory hole LMH is removed.

According to the semiconductor memory device 1 of the first embodiment, even if the memory holes LMH and UMH are misaligned, and even if at least one of the memory holes LMH and UMH is formed inclined, the upper edge of the memory hole LMH is disposed outside the area partitioned by the inner wall of the sidewall insulating layer SW when viewed from the top. Thereby, etching of the memory layer ME on the sidewall of the memory hole LMH is suppressed. As a result, ions entering from the memory hole UMH side are blocked by the sidewall insulating layer SW and are prevented from attacking the memory layer ME formed on the sidewall of the memory hole LMH.

According to the semiconductor memory device 1 of the first embodiment, the memory layer ME on the sidewall of the memory hole LMH is protected by the sidewall insulating layer SW. As a result, in the process of removing the protective layer CV and the memory layer ME on the bottom surface of the memory hole LMH, it is possible to establish a process with a sufficient margin while ensuring the detachability on the bottom surface of the memory hole LMH.

According to the semiconductor memory device 1 of the first embodiment, the height of the joint JTx where the sidewall insulating layer SW is disposed is substantially equal to the thickness of one set of the word line WL and the insulating layer OL, for example. Further, the height of the joint JTy is, for example, about twice the height of the joint JTx. Thereby, the memory layer ME on the sidewall of the memory hole LMH can be more reliably protected by the sidewall insulating layer SW.

Second Embodiment

Hereinafter, a second embodiment will be described in detail with reference to the drawings. The semiconductor memory device 2 of the second embodiment is different from the first embodiment described above in that a sidewall insulating layer is disposed on the entire surface of a joint.

Configuration Example of Semiconductor Memory Device

Figure 11:
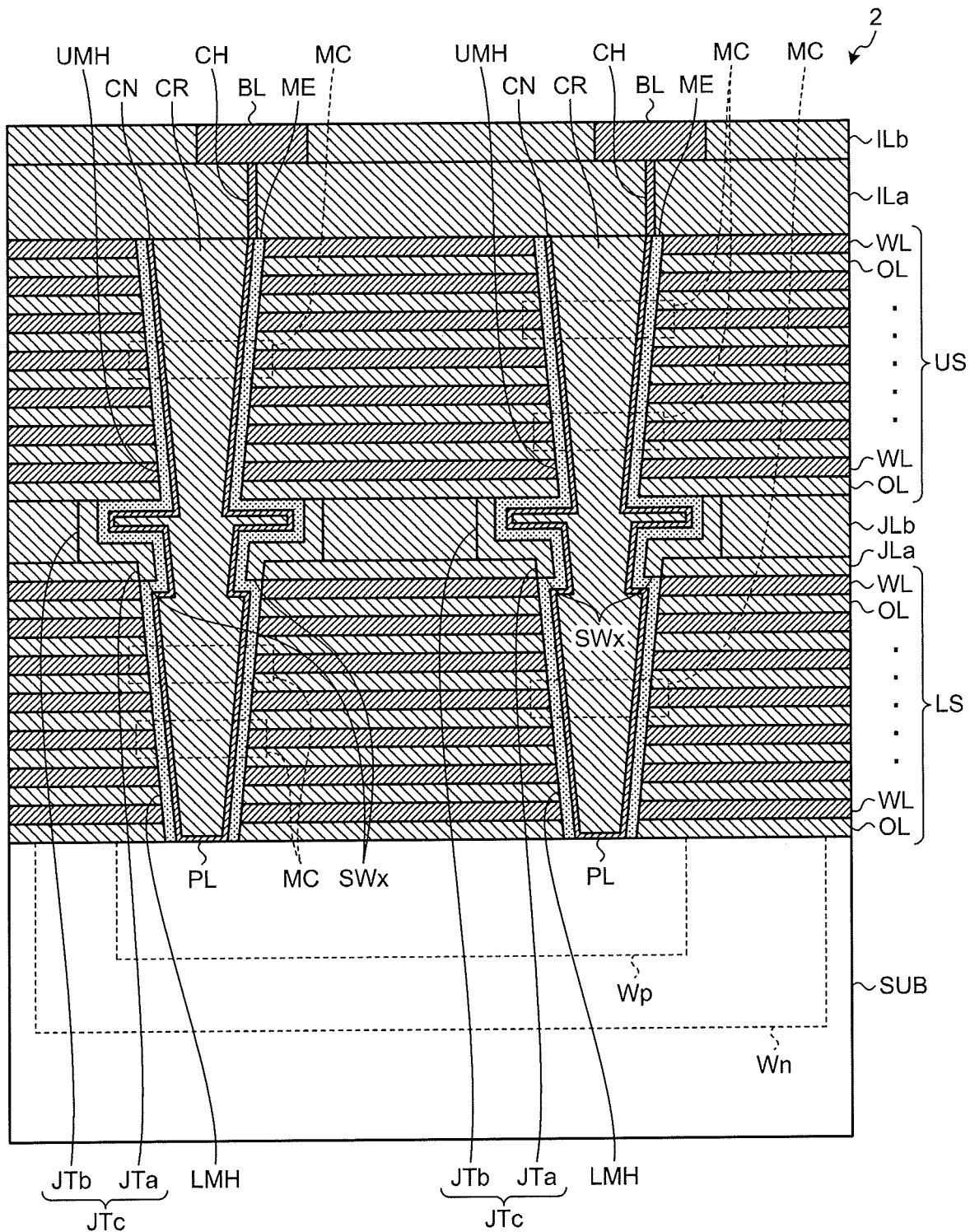
FIG. 11 is a cross-sectional view illustrating a configuration example of a semiconductor memory device according to a second embodiment.

FIG. 11 is a cross-sectional view showing a configuration example of the semiconductor memory device 2 according to the second embodiment. As illustrated in FIG. 11, the semiconductor memory device 2 is a three-dimensional nonvolatile memory including a substrate SUB and having memory cells MC three-dimensionally disposed above the substrate SUB, as with the semiconductor memory device 1 of the above-described first embodiment.

In the semiconductor memory device 2, a joint layer JLa is disposed on a stacked body LS, and a joint layer JLb is disposed on the joint layer JLa. The thickness of the joint layer JLa is substantially equal to the thickness of one set of a word line WL and an insulating layer OL of the stacked body LS, for example. The thickness of the joint layer JLb is, for example, about twice the thickness of the joint layer JLa. The joint layers JLa and JLb include different insulating layers having different wet etching rates.

Specifically, for example, the joint layer JLa is an insulating layer made of SiCO or the like, and the joint layer JLb is an insulating layer made of $SiO_2$ or the like. Further, for example, the joint layer JLa is an insulating layer made of TEOS or the like, and the joint layer JLb is an insulating layer made of BSG or the like. In addition to these examples, the joint layer JLa can be made of a material having a relatively slow wet etching rate, and the joint layer JLb can be made of a material having a relatively fast wet etching rate.

In the joint layers JLa and JLb, a joint JTc that joins and communicates a memory hole LMH and a memory hole UMH is disposed. The joint JTc includes a joint JTa as a first joint disposed in the joint layer JLa and a joint JTb as a second joint disposed in the joint layer JLb.

The inner wall of the joint layer JLa in the joint JTa is formed of a plane continuous with the inner wall surface of the memory hole LMH. That is, the inner wall surface of the joint layer JLa in the joint JTa and the inner wall surface of the memory hole LMH are on a continuous plane.

The joint JTb is disposed on the joint JTa. The diameter of the inner wall of the joint layer JLb in the joint JTb is larger than the diameter of the inner wall of the joint layer JLa in the joint JTa and larger than the diameter of the lower end of the memory hole UMH.

A sidewall insulating layer SWx is disposed on the inner wall of the joint layer JLa in the joint JTa and the inner wall of the joint layer JLb in the joint JTb. That is, the sidewall insulating layer SWx is disposed across the joints JTa and JTb. More specifically, the sidewall insulating layer SWx is continuously disposed on the inner wall of the joint layer JLa, the upper surface of the joint layer JLa, and the inner wall of the joint layer JLb. The sidewall insulating layer SWx is formed of insulating layers such as $SiO_2$.

By disposing the sidewall insulating layer SWx, the joint JTa has a diameter smaller than the diameter of the upper end of the memory hole LMH. That is, the inner diameter at the joint JTa of the sidewall insulating layer SWx is smaller than the diameter of the upper end of the memory hole LMH.

Even in the state where the sidewall insulating layer SWx is disposed, the joint JTb has a diameter larger than the diameter of the lower end of the memory hole UMH. That is, the inner diameter at the joint JTb of the sidewall insulating layer SWx is larger than the lower end diameter of the memory hole UMH.

Memory layers ME are disposed on the sidewalls of the memory holes UMH and LMH. The memory layer ME may also be disposed at the joint JTc. That is, the memory layer ME may be disposed on the bottom surface of the sidewall insulating layer SWx on the joint JTa side, the side surfaces of the joints JTa and JTb, and the upper surface on the joint JTb side.

Further, in the semiconductor memory device 2 configured as described above, the upper edge of the memory hole LMH is disposed outside an area partitioned by the inner wall of the sidewall insulating layer SWx disposed at the joint JTa when viewed from the top. That is, the sidewall insulating layer SWx functions as a self-alignment mask that is disposed in a self-aligned manner with respect to the memory hole LMH.

Note that the vertical direction in the semiconductor memory device 2 of the second embodiment is defined based on the shape of the joint JTc. Specifically, in the semiconductor memory device 2, the side on which the joint JTa having a small diameter is disposed is the lower side, and the side on which the joint JTb having a large diameter is disposed is the upper side.

Method of Manufacturing Semiconductor Memory Device

Next, a method of manufacturing the semiconductor memory device 2 according to the second embodiment will be described with reference to FIGS. 12A to 14B. FIGS. 12A to 14B are flowcharts illustrating an example of a procedure of a manufacturing method of the semiconductor memory device 2 according to the second embodiment. Note that, in FIGS. 12A to 14B, the lower layer structure of the semiconductor memory device 2 is shown as a base layer UL.

Figure 12A:
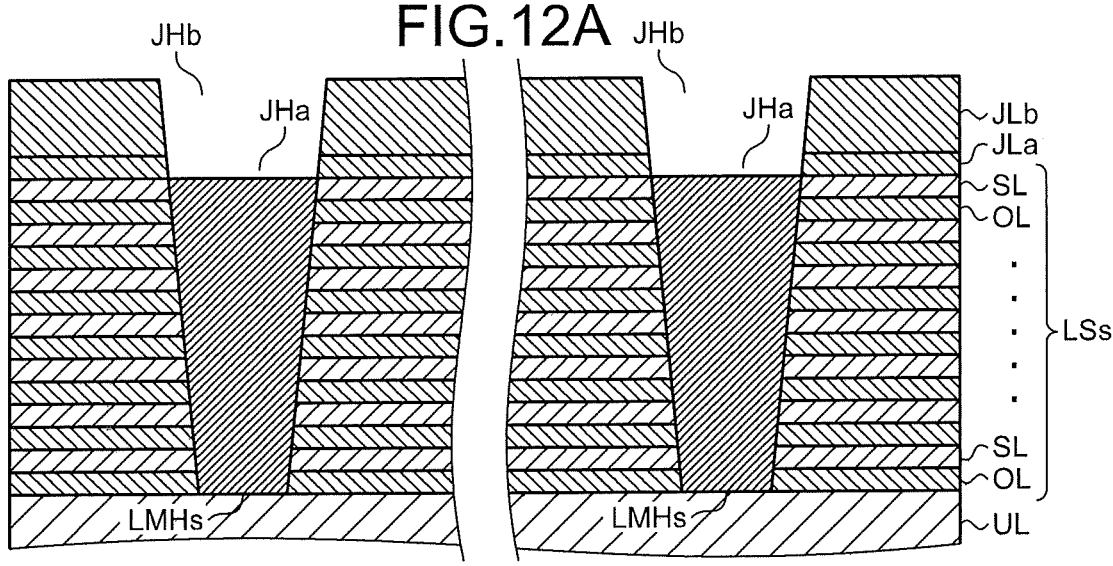
FIGS. 12A to 12C are flowcharts illustrating an example of a procedure of a manufacturing method of the semiconductor memory device according to the second embodiment.

As illustrated in FIG. 12A, a stacked body LSs in which a plurality of sacrificial layers SL and a plurality of insulating layers OL are alternately stacked is formed on the base layer UL. The joint layer JLa is formed on the stacked body LSs, and the joint layer JLb that is about twice as thick as the joint layer JLa is formed on the joint layer JLa.

A through hole penetrating the joint layers JLb and JLa and the stacked body LSs is formed, and joint holes JHb and JHa and a memory hole are formed.

A sacrificial layer formed of such as α-Si is formed on the entire surface of the joint layer JLb including the inside of the memory hole and etched back to form a columnar portion LMHs in which a memory hole is filled with the sacrificial layer.

Figure 12B:
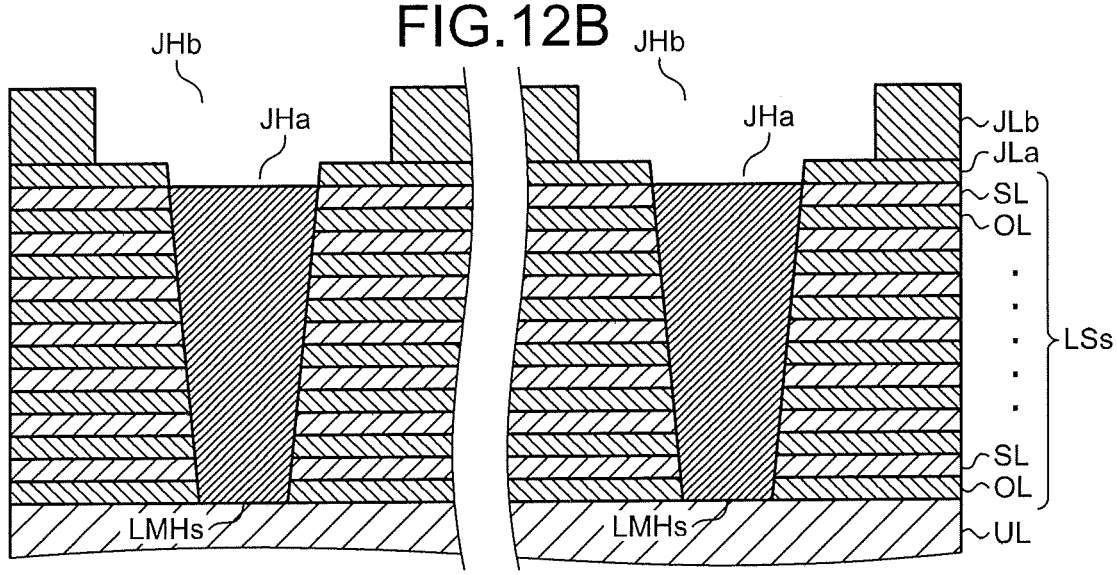

As illustrated in FIG. 12B, the diameter of the joint hole JHb formed in the joint layer JLb is enlarged by, for example, wet etching using DHF or the like. Here, as described above, since the joint layer JLa is formed of an insulating layer having a lower wet etching rate than the joint layer JLb, the joint hole JHa formed in the joint layer JLa is hardly enlarged.

Figure 12C:
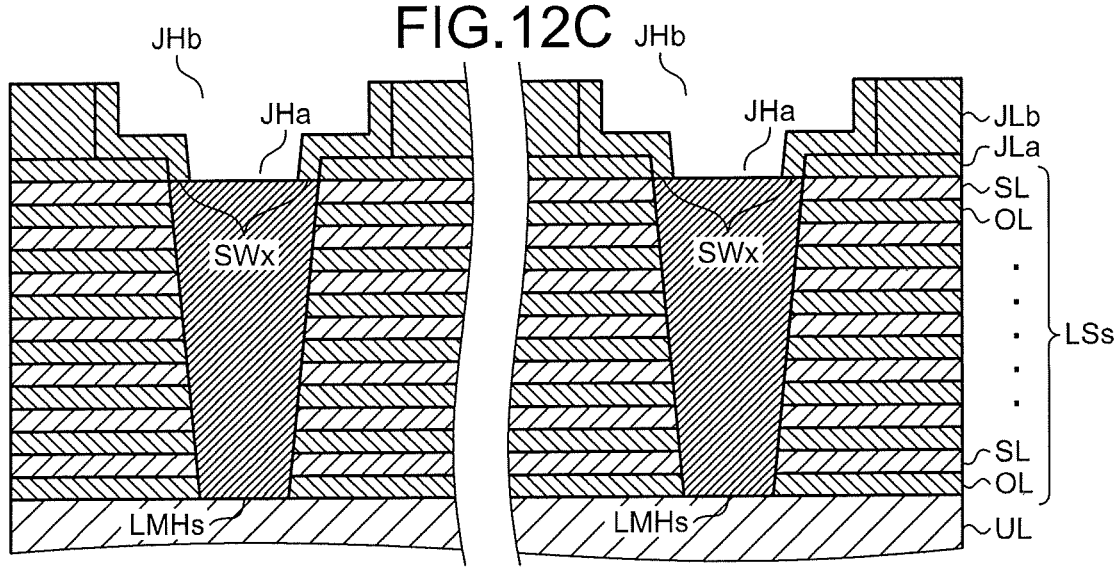

As illustrated in FIG. 12C, an insulating layer such as $SiO_2$ is formed on the entire surface of the joint layer JLb including the inside of the joint holes JHa and JHb, and etched back under anisotropic etching conditions to thereby form the sidewall insulating layer SWx on the inner wall of the joint holes JHa and JHb.

Figure 13A:
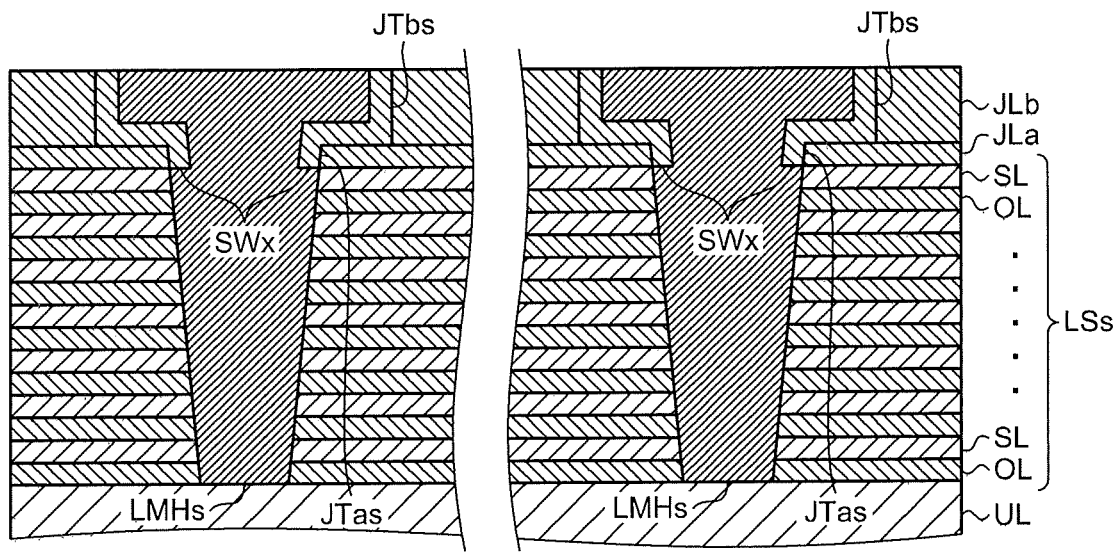
FIGS. 13A and 13B are flowcharts illustrating an example of a procedure of a manufacturing method of the semiconductor memory device according to the second embodiment.

As illustrated in FIG. 13A, the insides of the joint holes JHa and JHb are back-filled with a sacrificial layer formed of such as α-Si to form joints JTas and JTbs filled with the sacrificial layer.

Figure 13B:
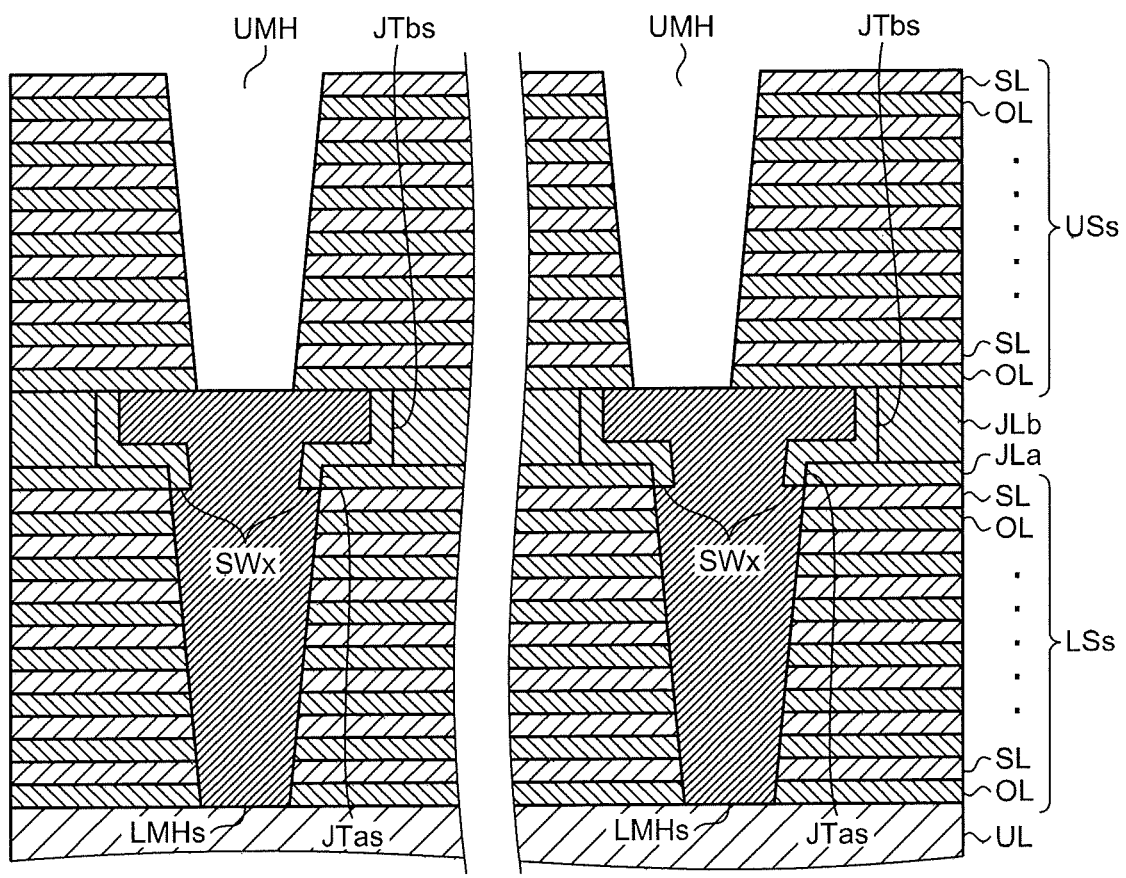

As illustrated in FIG. 13B, the stacked body USs in which a plurality of the sacrificial layers SL and a plurality of the insulating layers OL are alternately stacked is formed on the joint layer JLb. The memory hole UMH that penetrates the stacked body USs and reaches a joint JTbs is formed.

Figure 14A:
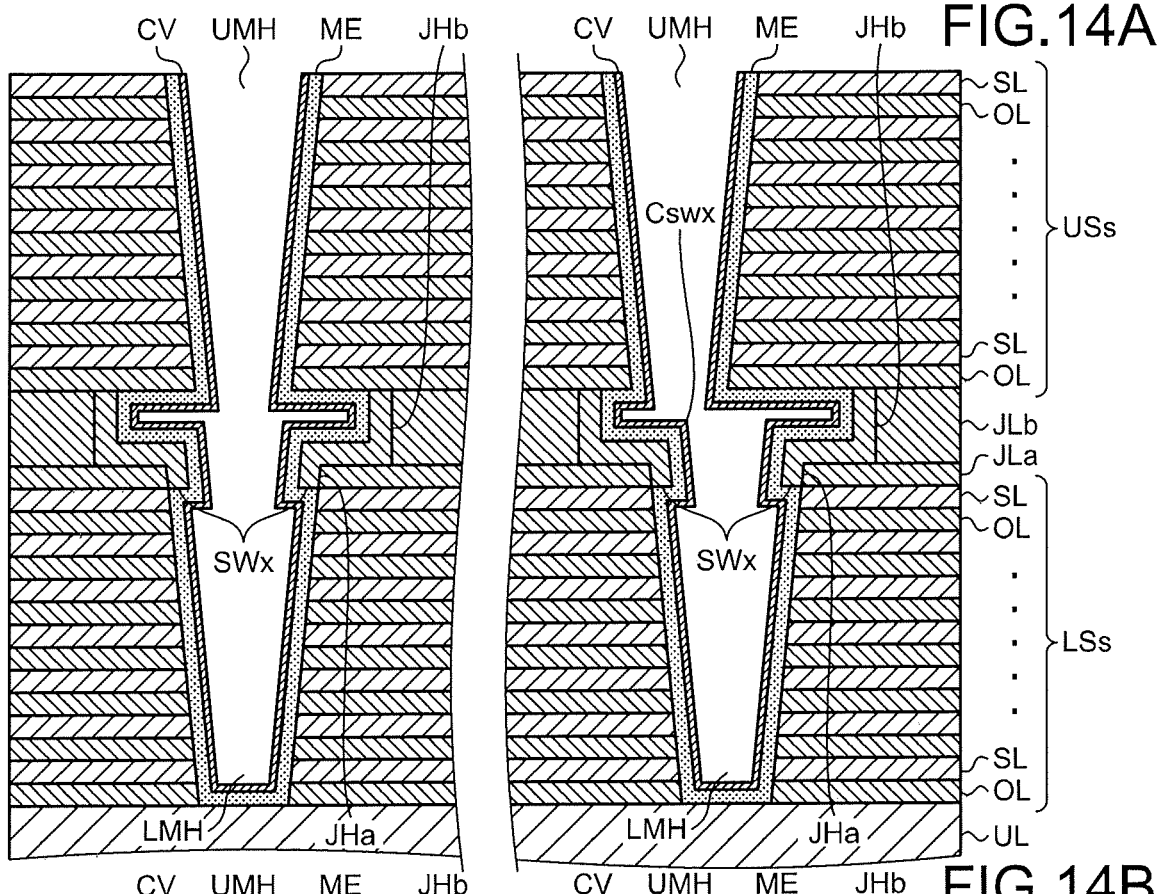
FIGS. 14A and 14B are flowcharts illustrating an example of a procedure of a manufacturing method of the semiconductor memory device according to the second embodiment.

As illustrated in FIG. 14A, the joint holes JHa and JHb and the sacrificial layer of the memory hole LMH are removed through the memory hole UMH. A memory layer ME and a protective layer CV are formed in this order on the inner wall surfaces of the memory hole UMH, the joint holes JHa and JHb, and the memory hole LMH.

At this time, as shown on the right side of FIG. 14A, in the portion where the misalignment of the memory holes UMH and LMH has occurred, a corner Cswx of the sidewall insulating layer SWx of the joint JTa covered with the protective layer CV and the memory layer ME may protrude into the hole bottom of the memory hole UMH.

Figure 14B:
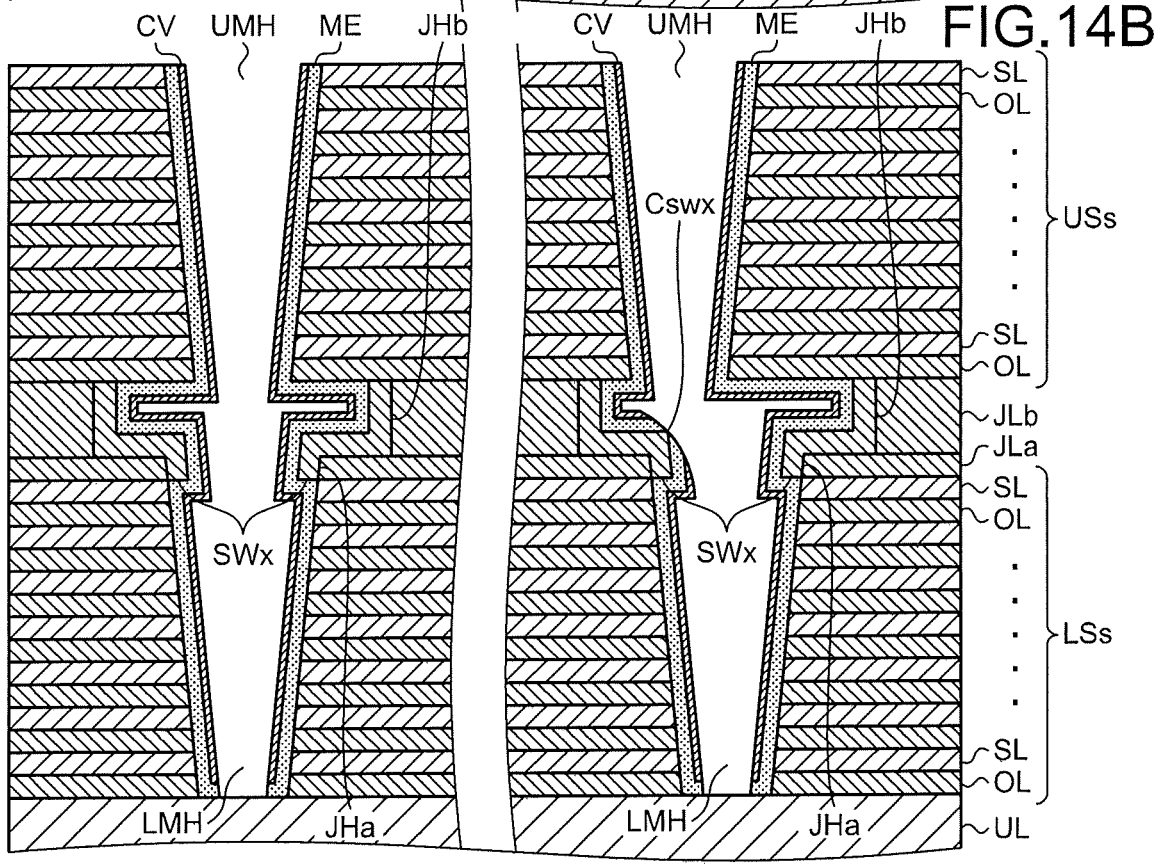

As illustrated in FIG. 14B, the protective layer CV and the memory layer ME on the bottom surface of the memory hole LMH are removed. At this time, as illustrated on the right side of FIG. 14B, at the portion where the misalignment of the memory holes UMH, LMH occurs, at the corner Cswx of the protruding sidewall insulating layer SWx, a part or all of the protective layer CV and the memory layer ME may be removed. The exposed sidewall insulating layer SWx may be partially etched.

However, even in the memory holes UMH and LMH where the misalignment has occurred, the etching of the memory layer ME on the sidewall of the memory hole LMH is prevented by being blocked by the sidewall insulating layer SWx.

Thereafter, the semiconductor memory device 2 of the second embodiment is manufactured through the manufacturing method of FIGS. 7A to 8B of the first embodiment described above and the formation process of the upper layer wiring and the like.

According to the semiconductor memory device 2 of the second embodiment, the same effects as those of the semiconductor memory device 1 of the first embodiment described above are obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a first stacked body including a plurality of first conductive layers and a plurality of first insulating layers alternately stacked;
   a second stacked body disposed above the first stacked body and including a plurality of second conductive layers and a plurality of second insulating layers alternately stacked;
   a first memory hole extending in the first stacked body in a first direction that is a stacking direction of the first stacked body;

a second memory hole extending in the second stacked body in the first direction; and a joint that communicates the first memory hole and the second memory hole, wherein the joint comprises:

an inner wall surface having a plane continuous with an inner wall surface of the first memory hole, a sidewall insulating layer disposed on the inner wall surface of the joint, a first joint in which the sidewall insulating layer is disposed, the first joint having a diameter smaller than a diameter of an upper end of the first memory hole, and a second joint disposed on the first joint and having a diameter larger than a diameter of a lower end of the second memory hole, wherein the sidewall insulating layer is also disposed in the second joint;

an inner wall surface of the sidewall insulating layer disposed in the second joint has a diameter larger than the diameter of the lower end of the second memory hole.

2. A method of manufacturing a semiconductor memory device, comprising:

forming a first stacked body including a plurality of first insulating layers and a plurality of second insulating layers alternately stacked;

forming a joint layer on the first stacked body;

forming a joint hole that penetrates the joint layer, and a first memory hole that communicates with the joint hole by penetrating the first stacked body continuously from the joint hole;

forming a sidewall insulating layer on at least a part of an inner wall of the joint hole;

forming a second stacked body in which a plurality of third insulating layers which are a same type as the first insulating layer and a plurality of fourth insulating layers that are a same type as the second insulating layer are alternately stacked on the joint layer; and forming a second memory hole penetrating the second stacked body and communicating with the joint hole of the joint layer, wherein:

when the sidewall insulating layer is formed, enlarging a diameter of an upper part of the joint hole;

forming the sidewall insulating layer on an inner wall surface of a lower part and the enlarged upper part of the joint hole; and forming the joint hole having the sidewall insulating layer in the upper part and the lower part.

3. The method of manufacturing a semiconductor memory device according to claim 2, wherein, when the second memory hole is formed, forming the second memory hole such that a lower end of the second memory hole is located in an area partitioned by the enlarged joint hole.

* * * * *